(12) United States Patent
Dogiamis et al.

(10) Patent No.: US 12,266,840 B2
(45) Date of Patent: Apr. 1, 2025

(54) WAVEGUIDE INTERCONNECTS FOR SEMICONDUCTOR PACKAGES AND RELATED METHODS

(71) Applicant: Intel Corporation, Santa Clara, CA (US)

(72) Inventors: Georgios Dogiamis, Chandler, AZ (US); Johanna Swan, Scottsdale, AZ (US); Adel Elsherbini, Tempe, AZ (US); Shawna Liff, Scottsdale, AZ (US); Beomseok Choi, Chandler, AZ (US); Qiang Yu, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 17/359,138

(22) Filed: Jun. 25, 2021

(65) Prior Publication Data
US 2022/0416393 A1 Dec. 29, 2022

(51) Int. Cl.
| | |
|---|---|
| H01P 3/16 | (2006.01) |
| H01L 23/538 | (2006.01) |
| H01L 23/66 | (2006.01) |
| H01L 25/065 | (2023.01) |
| H01P 1/208 | (2006.01) |
| H01P 5/107 | (2006.01) |

(52) U.S. Cl.
CPC ............ *H01P 3/16* (2013.01); *H01L 23/5384* (2013.01); *H01L 23/66* (2013.01); *H01L 25/0657* (2013.01); *H01P 1/2088* (2013.01); *H01P 5/107* (2013.01); *H01L 2223/6627* (2013.01)

(58) Field of Classification Search
CPC .......... H01P 3/16; H01P 1/2088; H01P 5/107; H01P 1/04; H01L 23/5384; H01L 23/66; H01L 25/0657; H01L 2223/6627; H01L 2223/6616; H01L 2225/06548; H01L 24/80; H01L 25/0652; H01L 23/5383; H01L 2223/6622; H01L 2223/6677; H01L 2225/06531; H01L 2225/06572
See application file for complete search history.

(56) References Cited

U.S. PATENT DOCUMENTS

| | | | |
|---|---|---|---|
| 10,992,017 B2 | 4/2021 | Kamgaing et al. | |
| 2013/0075904 A1* | 3/2013 | Cho | H01P 5/022 216/17 |

(Continued)

OTHER PUBLICATIONS

Holloway et al., "A 105Gb/s Dielectric-Waveguide Link in 130nm BiCMOS Using Channelized 220-to-335GHz Signal and Integrated Waveguide Coupler," ISSCC 2021/Session 11/Advanced Wireline Links and Techniques/11.9, Feb. 17, 2021, 3 pages.

*Primary Examiner* — John W Poos
(74) *Attorney, Agent, or Firm* — Hanley, Flight & Zimmerman, LLC

(57) ABSTRACT

Waveguide interconnects for semiconductor packages are disclosed. An example semiconductor package includes a first semiconductor die, a second semiconductor die, and a substrate positioned between the first and second dies. The substrate includes a waveguide interconnect to provide a communication channel to carry an electromagnetic signal. The waveguide interconnect is defined by a plurality of through substrate vias (TSVs). The TSVs in a pattern around the at least the portion of the substrate to define a boundary of the communication channel.

22 Claims, 12 Drawing Sheets

(56) References Cited

U.S. PATENT DOCUMENTS

| | | | |
|---|---|---|---|
| 2016/0276729 A1* | 9/2016 | Dang | H01P 5/107 |
| 2020/0006235 A1* | 1/2020 | Aleksov | H01L 23/5386 |
| 2020/0091128 A1* | 3/2020 | Elsherbini | H01L 23/5386 |

* cited by examiner

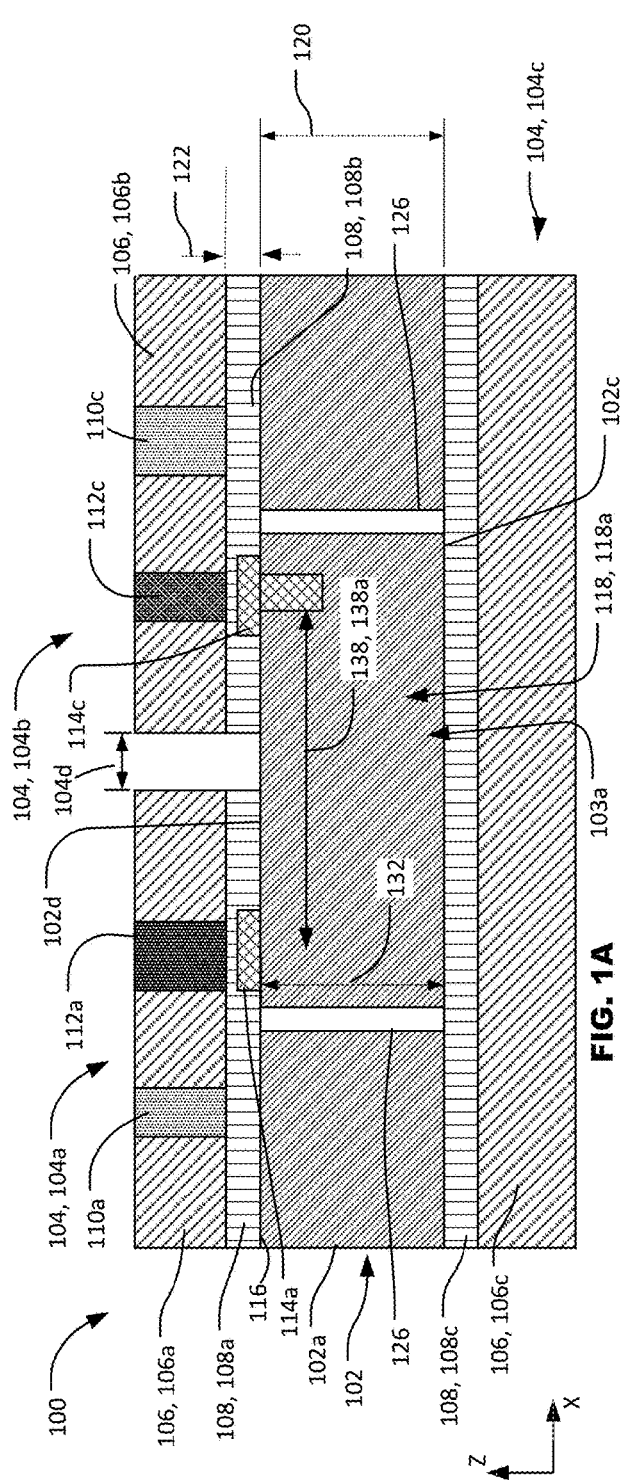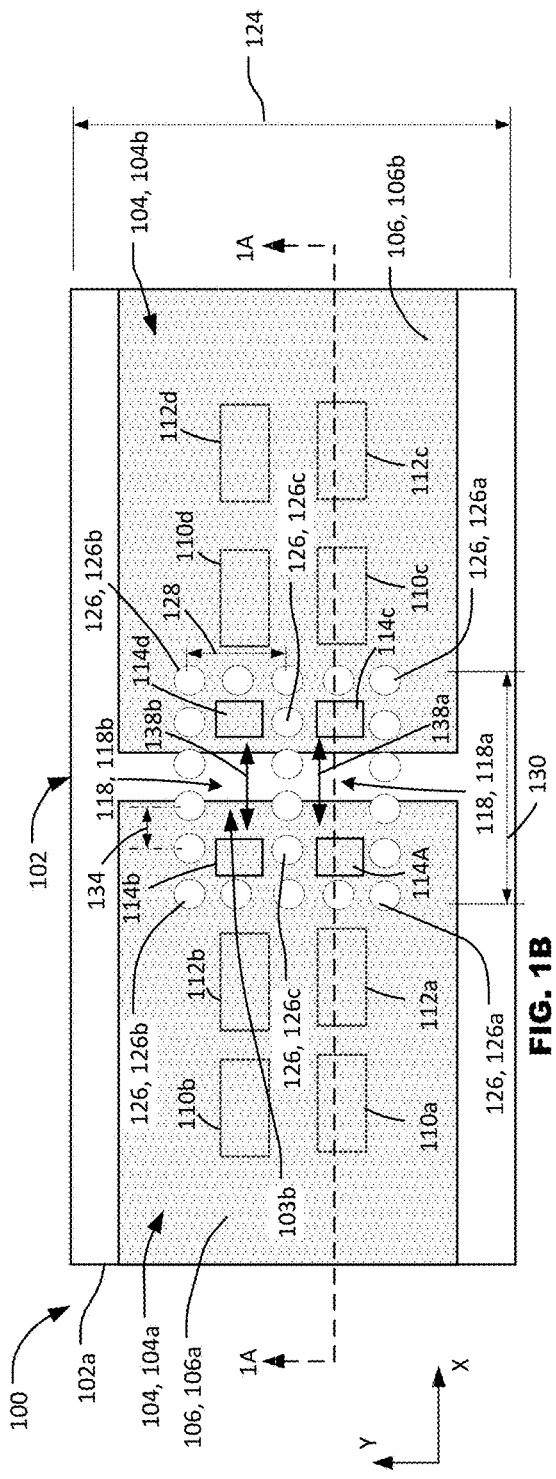
FIG. 1A
FIG. 1B

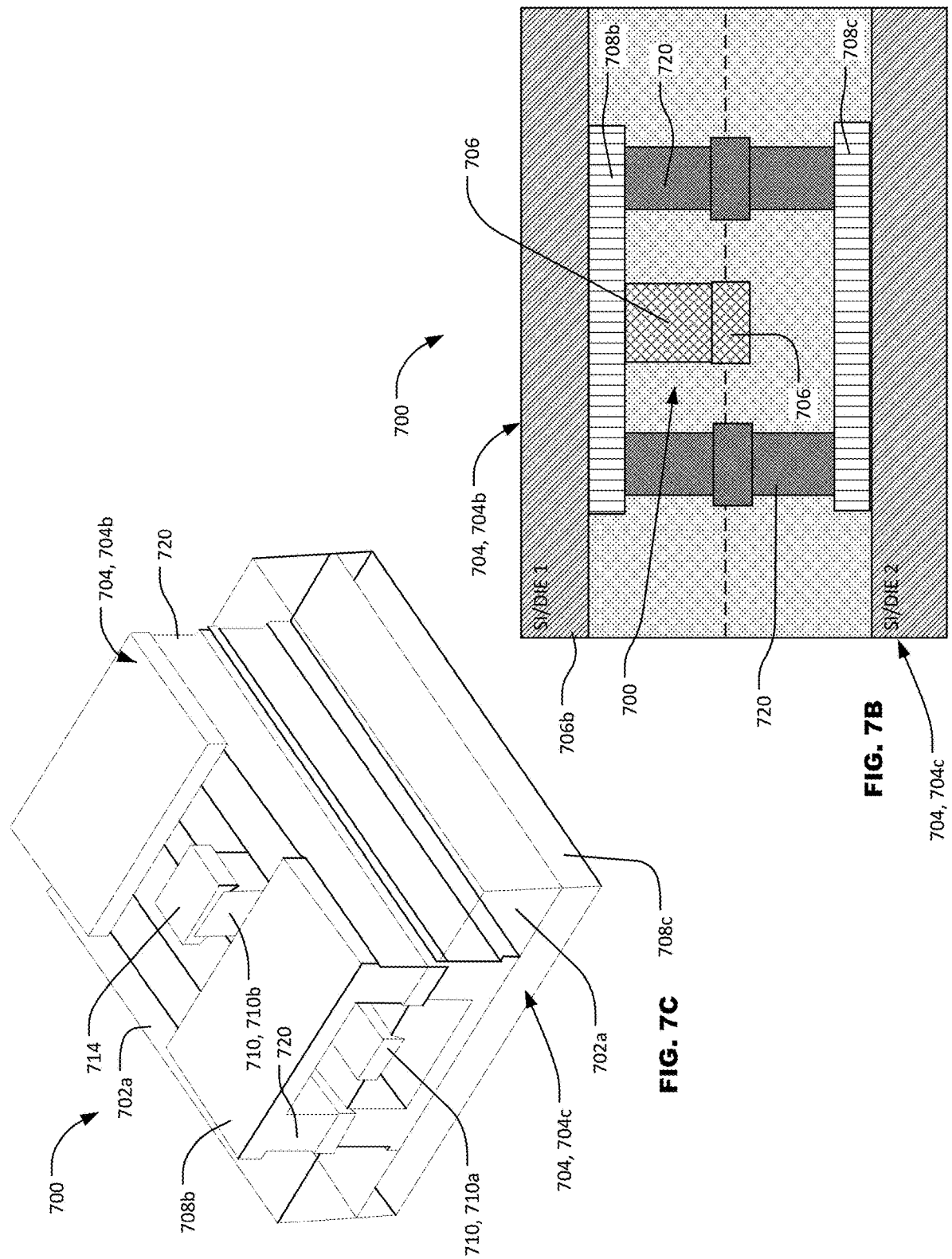

WAVEGUIDE INTERCONNECTS FOR SEMICONDUCTOR PACKAGES AND RELATED METHODS

FIELD OF THE DISCLOSURE

This disclosure relates generally to integrated circuit packaging and, more particularly, to waveguide interconnects for semiconductor packages and related methods.

BACKGROUND

The rapid surge of data transmission within computation, storage and communication infrastructures is pushing the speed boundary of traditional copper-based electrical links. Additionally, with the increasing functionality of circuitry and increasing density of semiconductor devices, it has become increasingly difficult to physically position a sufficient number of interconnects on an exterior surface of a die. Die stacking allows for multi-chip package structures that enable significant performance leaps in computing capability and memory/processor integration.

BRIEF DESCRIPTION OF THE DRAWINGS

FIG. 1A is a cross-sectional view of an example semiconductor package including an example waveguide interconnect constructed in accordance with teachings of this disclosure.

FIG. 1B is a top, partially transparent view of the example semiconductor package of FIG. 1A.

FIGS. 7A-7C illustrate an example semiconductor package including another example waveguide interconnect disclosed herein.

Figure 2A:
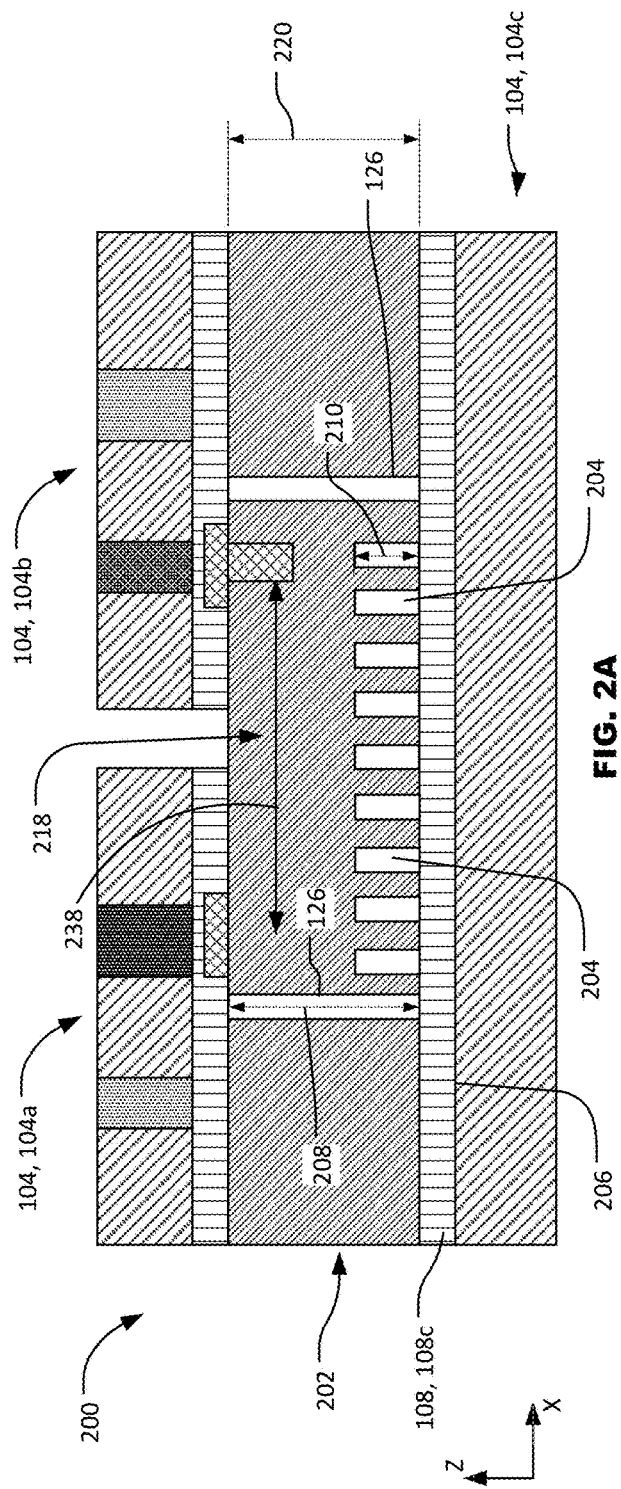
FIG. 2A is a cross-sectional view of an example semiconductor package including another example waveguide interconnect disclosed herein.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc.

DETAILED DESCRIPTION

When constructing multi-chip package structures, it is important to implement interconnect structures that enable efficient and effective communication between package components such as integrated circuit OC) chips memory, network on chip (NoC) components, processing elements, etc. Advanced processing systems require high bandwidth and low power interconnects between their subsystems. Some systems can require extremely high-speed frequency links on the order of several hundred gigahertz (GHz) to a terahertz (THz) between circuitry within a die and/or between different dies of a computing system or semiconductor package. The high bandwidth enables faster processing speeds for bandwidth intensive workloads (e.g., machine learning applications) and the low power improves the computation efficiency (e.g., power per watt). For instance, the ability to implement high-speed communication links in package structures that are capable of transmitting data rates in the range of Gbps (Gigabits per second) to hundreds of Gbps are advantageous for various types of systems (e.g., radar, imaging, computer server systems, etc.) designed to operate at millimeter-wave frequencies (e.g., between 30 gigahertz (GHz) and 300 gigahertz (GHz)) or higher speed signals having Terahertz frequencies.

To transmit multiple and/or high frequency signals between package components, semiconductor packages often employ planar transmission lines such as microstrip, stripline, and coplanar waveguide transmission lines. While these transmission lines are sufficient for transmitting lower frequency signals (e.g., frequencies that less than 300 gigahertz GHz), signal attenuation and frequency dispersion occurs when using such transmission lines to transmit high frequency signals. Thus, high frequency signals transmitted over such transmission lines (e.g., coplanar waveguide, a stripline, a microstrip, etc.) can be lossy. Additionally, traditional transmission lines are often formed on backend layers of semiconductor dies, which have thicknesses typically on the order of a few micrometers (e.g., between 2 µm and 10 µm). As a result, radio frequency transmission lines often demonstrate undesirable levels of insertion loss due to proximity to an underlying ground plane (e.g., also formed in the backend layer). Indeed, there is a relatively small distance (e.g., thickness or space) between the transmission lines and the ground plane (e.g., a few micrometers, for example, between 2 µm and 10 µm) limiting therefore a maximum achievable interconnect distance As integrated circuit (IC) chips and/or dies reduce in size and interconnect densities increase, alternatives to physical and electrical connection components are needed for providing stable transmission of high frequency data signals between different circuitry. A solution is to modulate a higher frequency signal and wirelessly transmit the modulated, high frequency signal between dies within a semiconductor package. In this manner, multiple frequencies can be transmitted simultaneously using a single channel and higher order modulation schemes can be implemented to increase data transfer rates.

To overcome some of the issues with traditional transmission line configurations, some semiconductor packages employ die-to-die stacking and/or interconnects provided by hybrid bonding manufacturing technique(s) and/or process(es). With die-to-die stacking configurations, higher frequency signals can be modulated between two or more adjacent dies of a semiconductor package. Additionally, hybrid bonding manufacturing techniques enable different components or layers of a semiconductor package to be manufactured separately and then joined to form a near-monolithic substrate package. As used herein, monolithic semiconductor package is defined as a semiconductor package formed from a unitary or single wafer. A near-monolithic semiconductor package as used herein is defined to mean that individual components (e.g., the semiconductor dies, interposers, etc.) can be manufactured separately, but the semiconductor package appears to be monolithic when the separate components are coupled or bonded together (e.g., via hybrid bonding) in a single the semiconductor package.

For instance, some semiconductor packages employ waveguides that are assembled on a die using connectors and epoxy glue. However, such known waveguide channels can be susceptible to misalignment during assembly, thereby increasing manufacturing costs and decreasing production output. In some examples, waveguides have transmission lines forming a fanout pattern to enable signals to travel to different dies operatively coupled to the waveguides. However, the fanout configuration requires a significant amount of area and, in some instances, cannot be integrated on a back-end of the die due to space limitations. Further, substrate integrated waveguides often have thicknesses between 50 and 200 micrometers (µm). As such, they may not be usable at the back-end level as layers at the back-end layer are typically on the order of a few micrometers (e.g., between 2 µm and 10 µm). Increasing the thickness of the backend layer to values greater than 10 micrometers can cause the die or wafer to bow or deform. Thus, increasing the thickness of the backend layer to accommodate substrate integrated waveguides is not feasible.

Example waveguide interconnects disclosed herein employ a waveguide interconnect to carry, transmit or propagate electromagnetic signals to communicatively couple semiconductor dies (chiplets) of a semiconductor package. In some examples disclosed herein, a waveguide interconnect includes an intermediate standoff substrate to form an effective medium waveguide (e.g., using a dielectric material) or a partially metallic substrate integrated waveguide (SIW). In some examples, the intermediate standoff substrates disclosed herein provide an interconnect that communicatively couples one or more chiplets or circuits.

Examples disclosed herein enable high data rate communication between package components (e.g., data rates in the range of Gbps to hundreds of Gbps) with negligible signal loss and/or degradation and, thus, are well suited for systems having operating frequencies in the range of millimeter-wave frequencies (e.g., between approximately 30 gigahertz and 300 gigahertz) to Terahertz frequencies and higher, for example. Example waveguide interconnects disclosed herein can be transmit electromagnetic signals, microwave signals, radio frequency signals, and/or any other type(s) of signals. In some waveguide interconnects disclosed herein, an intermediate standoff substrate or layer to forms an effective medium waveguide or metallic substrate integrated waveguide (SIW). In some waveguide interconnects disclosed herein, an intermediate standoff substrate or layer creates a (e.g., vertical) near-field coupling structure. Some example waveguide interconnects disclosed herein include means for low loss radio frequency mm-Wave interconnect by enabling a single layer of stripline or coplanar-waveguide (CPW) line for use, for example, with high-frequency signals. Some waveguide interconnects disclosed herein provide a substrate thickness that is 10-50 times thicker than traditional backend dielectric layer thicknesses (e.g., 0.1 to 5 micrometers). This increased thickness results in low insertion loss transmission lines. Some waveguide interconnects disclosed herein, in combination with electromagnetic signal launchers and ICs (e.g., transmitter, receiver, transceiver, etc.), enable a near-monolithic THz interconnect over dielectric waveguides. Some example waveguide interconnects disclosed herein, in combination with vertical near-field signal launchers and ICs (e.g., transmitter, receiver, transceiver, etc.) enable a non-contact (e.g., contactless) vertical THz interconnect among chiplets.

As used herein, the term "electromagnetic frequency signals" and abbreviation "EM signal(s)" refer to any or all signals with frequencies that fall within the portion of the electromagnetic frequency spectrum that extends from about 5 kilohertz (5 kHz) to about 1 terahertz (1 THz), or greater. As used herein, the term "millimeter-wave" (i.e., mm-wave) refers to any or all of the frequencies that fall within the portion of the electromagnetic frequency spectrum that extends from about 30 GHz to about 300 GHz. As used herein, the term "high speed frequency signals" or "sub-THz EM signals" refer to any or all signals with frequencies that fall within the portion of the electromagnetic frequency spectrum that extends from about 300 GHz to about 1 THz, or more. Thus, examples disclosed herein transmit radio frequency signals that can have speeds of about or exceeding 1 THz.

Example semiconductor dies or chiplets disclosed herein can implement controllers, microprocessors, Digital Signal Processors (DSPs), Central Processor Units (CPUs), Graphics Processor Units (GPUs), programmed microprocessors, Field Programmable Gate Arrays (FPGAs), Application Specific Integrated Circuits (ASICs), Reduced Instruction Set Computers (RISCs), any other circuitry and/or combinations thereof. Additionally, example semiconductor dies disclosed herein (e.g., semiconductor dies 104a, 104b of FIGS. 1A and 1B) may be chiplets of a disaggregated die. Each chiplet may implement a dedicated function. Together, the chiplets may implement a complex circuitry. The complex circuitry can be any type of device that can be implemented as a plurality of chiplets that are physically separated from, but communicatively coupled to, one another. For example, processor circuitry may be implemented by two or more separate chiplets that together implement a microprocessor, etc. Alternatively, in other examples, example semiconductor dies disclosed herein may be different chips (e.g., a processor circuitry, a memory, and/or or some other type of component) that together implements a system on a chip (SoC) in a semiconductor package.

FIG. 1A is a cross-sectional view of an example semiconductor package 100 including an example waveguide interconnect 102 in accordance with teachings of this disclosure. FIG. 1A is a cross-section taken along line 1A-1A of FIG. 1B. FIG. 1B is a top, partially transparent view of the example semiconductor package 100 of FIG. 1A. FIG. 1B is transparent to illustrate various internal components of the semiconductor package 100. However, the internal components may not actually be visible. The semiconductor package 100 of the illustrated example is a die-to-die configuration.

The semiconductor package 100 of the FIG. 1 includes a plurality of semiconductor dies 104 and the waveguide interconnect 102. In the illustrated example, the semiconductor dies 104 include a first semiconductor die 104a (e.g., a first chiplet), a second semiconductor die 104b (e.g., a second chiplet) and a third semiconductor die 104c (e.g., a base semiconductor die). The waveguide interconnect 102 of the illustrated example includes a standoff substrate 102a (e.g., a body or dielectric layer) positioned between the third semiconductor die 104c and the first and second semiconductor dies 104a, 104b.

Additionally, as described in greater detail below, the waveguide interconnect 102 of the illustrated example communicatively couples the first semiconductor die 104a and the second semiconductor die 104b. To this end, the standoff substrate 102a includes a plurality of through substrate vias (TSVs) 126. Specifically, the standoff substrate 102a and the TSVs 126 define one or more communication channels 118 to carry an electromagnetic signal communication (e.g., enable EM signals to transmit or transfer) between the first semiconductor die 104a and the second semiconductor die 104b.

The semiconductor dies 104 of the illustrated example are oriented in a stacked configuration (e.g., a vertical stacked configuration). In the illustrated example, the first semiconductor die 104a is positioned proximate to and/or in a same vertical plane and/or elevation as the second semiconductor die 104b For example, the first semiconductor die 104a of the illustrated example is spaced (e.g., laterally or sideways) from the second semiconductor die 104b by a lateral or horizontal gap 104d in the orientation of FIG. 1A. Additionally, the first semiconductor die 104a and the second semiconductor die 104b of the illustrated example are oriented with their active sides facing the third semiconductor die 104c. Specifically, active sides of the respective first and second semiconductor dies 104a, 104b, are oriented toward an active side of the third semiconductor die 104c. Although the example of FIGS. 1A and 1B includes two semiconductor dies 104a, 104b (e.g., chiplets), the semiconductor package 100 of the illustrated example can be formed with more than two semiconductor dies or chiplets (e.g., a plurality of chiplets, three chiplets, ten chiplets, etc.). In some examples, the semiconductor package 100 of the illustrated example is coupled to a printed circuit board (e.g., via the third semiconductor die 104c) and/or any other substrate.

The semiconductor dies 104 of the illustrated example include a die layer 106 and backend layer 108. For example, the first semiconductor die 104a includes a first die layer 106a coupled to a first backend layer 108a, the second semiconductor die 104b includes a second die layer 106b coupled to a second backend layer 108b, and the third semiconductor die 104c includes a third die layer 106c coupled to a third backend layer 108c. When coupled together, the backend layers 108 electrically and/or communicatively couple one or more components of the respective ones of die layers 106. For example, the die layers 106 (e.g., front side) may include communication or logic components (e.g., transistors) and the backend layers 108 may include interconnecting conductive layers (e.g., metallic layers) to form one or more logic circuits between different communication or logic components (e.g., transistors) of the respective die layers 106. For example, the backend layers 108 can be made of silicon material and can include a plurality of vias or traces (e.g., metallic layers) formed of electrically conductive materials to allow signals to propagate through the backend layers 108 (e.g., either vertically, horizontally, or any other direction). In some examples, the backend layers 108 can have other electronic components (e.g., processor circuitry to perform one or more logical computations, a memory, etc.). The other various components (e.g., transistors, traces, vias, etc.) of the die layers 106 and/or the backend layers 108 are not shown for sake of clarity For example, the first semiconductor die 104a (e.g., a first die layer 106a and a first backend layer 108a) includes a first logic circuit 110a, a second logic circuit 110b, a first transceiver 112a (e.g., an electromagnetic (EM) transceiver), a second transceiver 112b e.g., an electromagnetic (EM) transceiver), a first signal launcher 114a (e.g., an electromagnetic (EM) signal launcher), and a second signal launcher 114b (e.g., an electromagnetic (EM) signal launcher). In the illustrated example, the first backend layer 108a includes the first signal launcher 114a and a second signal launcher 114b. In the illustrated example, some or all of the logic circuits 110a, 110b, the first and second transceivers 112a, 112b, and/or the first and second signal launchers 114a, 114b are disposed in or on the first semiconductor die 104a. In some implementations, some or all of the logic circuits 110a, 110b, the first and second transceivers 112a, 112b, and/or the first and second signal launchers 114a, 114b can be disposed in or on a plurality of semiconductor dies.

In the illustrated example, the second semiconductor die 104b (e.g., the second die layer 106b and the second backend layer 108b) includes a third logic circuit 110c, a fourth logic circuit 110d, a third transceiver 112c (e.g., an electromagnetic (EM) transceiver), a fourth transceiver 112d (e.g., an electromagnetic (EM) transceiver), a third signal launcher 114c (e.g., an electromagnetic (EM) signal launcher), and a fourth signal launcher 114d (e.g., an electromagnetic (EM) signal launcher). In the illustrated example, the second backend layer 108b includes the third signal launcher 114c and the fourth signal launcher 114d. In the illustrated example, some or all of the logic circuits 110c, 110d, the third and fourth transceivers 112c, 112d, and/or the third and fourth signal launchers 114c, 114d are disposed in or on the second semiconductor die 104b. In some implementations, some or all of the logic circuits 110c, 110d, the third and fourth transceivers 112c, 112d, and/or the first and second signal launchers 114c, 114d can be disposed in or on a plurality of semiconductor dies.

The signal launchers 114a-d can include any number and/or combination of devices and/or systems capable of receiving the high frequency electromagnetic signals from the transceivers 112a-d and launching the high frequency signals into the waveguide interconnect 102. In some examples, at least a portion of respective ones of the signal launchers 114a-d is communicably coupled to respective ones of the transceivers 112a-d. The signal launchers 114a-d can be communicably coupled to the respective ones of the transceivers 112a-d via one or more conductive members, such as for example, one or more: traces, vias (e.g., different from the TSVs 126), or combinations thereof formed, for example, in the backend layers 108. In some examples, the signal launchers 114a-d of the illustrated example can be planar launchers such as tapered slot launchers, probe fed waveguide channel launchers, any other type of signal launcher and/or any combination thereof. For example, in the illustrated example, the first signal launcher 114a is a planar launcher formed in the first backend layer 108a of the first semiconductor die 104a. In this example, the first signal launcher 114a is a planar launcher that is substantially flush with an edge 116 of the first backend layer 108a and the first transceiver 112a engages (e.g., directly engages or engages via an intermediate layer) the waveguide interconnect 102. In other words, the first signal launcher 114a is formed entirely in the backend layer 108. In contrast, the third signal launcher 114c is formed m both the second backend layer 108b and the waveguide interconnect 102. For example, a first portion of the third signal launcher 114c is formed in the second backend layer 108b and a portion of the third signal launcher 114c is formed in the waveguide interconnect.

The logic circuits 110a-d can include any number of and/or combination of systems and/or devices capable of calculating, processing, transmitting, receiving and/or communicating one or more signals that include information and/or data. Example logic circuits 110a-d can include, but not limited to, one or more microcontrollers, microprocessors, digital signal processors (DSPs), central processing units (CPUs), graphical processing units (GPUs), application specific integrated circuits (ASICs), reduced instruction set computers (RISCs), serializer-deserializer (SERDES) circuits, field programmable gate array (FPGA), clock generation circuits, phase locked loop (PLL) circuitry, equalization circuitry, any other circuit and/or any combination thereof.

As noted above, to communicatively and/or electrically couple the first semiconductor die 104a and the second semiconductor die 104b, the semiconductor package 100 employs the waveguide interconnect 102. The standoff substrate 102a of the waveguide interconnect 102 is a body or layer composed of a dielectric material, a low loss polymer, glass, silicon, alumina, silicon dioxide ($SiO_2$), silicon nitride ($Si_3N_4$), aluminum nitride (AlN), silicon carbon nitride (SiCN), ceramic filled polymer, and/or any other material (e.g., organic and non-organic) that enables propagation of electromagnetic waves. In some examples, the standoff substrate 102a consists of a dielectric material. The standoff substrate 102a can have a dielectric constant that can range between about 3 (e.g., organic polymers, glass~4) and 12 (e.g., silicon~11.7, alumina~10). In some examples, the standoff substrate 102a can be an interposer. An interposer can include, in addition to the TSVs 126, any number of plies, laminates, trenches or layers some or all of which may contain any number of conductive traces, other vias (e.g., separate from the TSVs 126) or similar structures that communicatively and/or electrically couples two or more of the semiconductor dies 104.

The standoff substrate 102a of the illustrated example has a substrate thickness 132 in a z-direction of a reference cartesian coordinate system (e.g., a vertical or stack-up direction in the orientation of FIG. 1A). The substrate thickness 120 of the illustrated example can be approximately 10 to 50 times greater than a backend layer thickness 122 of the backend layers 108. For example, the backend layer thickness 122 can be between approximately 0.1 and 5 micrometers. For example, the substrate thickness 120 can be approximately between 1 micrometer and 250 micrometers. Increasing a thickness of the standoff substrate 102a enables an increased distance or separation in the z-direction between the backend layers 108 of the third semiconductor die 104c and the first and second semiconductor dies 104a, 104b. A greater an amount of separation between the semiconductor dies 104 in the z-direction reduces signal loss and/or signal interference, thereby improving performance (e.g., improving signal integrity as the signals propagate within the channels 118) of the semiconductor package 100. In some examples, a width 124 of the standoff substrate 102a (i.e., a y-direction of the reference cartesian coordinate system) can range between approximately 100 micrometers and 3 millimeters for signals having frequencies between approximately 50 GHz and 1 THz.

The waveguide interconnect 102 of the illustrated example enables transmission of electromagnetic (EM) frequency communication (e.g., radio frequency (RF) communication) between the first and second semiconductor dies 104a, 104b. To enable electromagnetic frequency communication between the first and second semiconductor dies 104a, 104b, the waveguide interconnect 102 of the illustrated example defines the one or more channels 118 (e.g., communication channels). In particular, each one of the channels 118 provides a dedicated communication pathway (e.g., a sideways, horizontal or lateral channel) to span a distance between a pair of the communicatively coupled signal launchers 114. However, in some examples, a channel 118 disclosed herein can communicatively couple one or more signal launchers 114 from the first semiconductor die 104a and one or more signal launchers 114 from the second semiconductor die 104b.

For example, as shown in FIG. 1B, the waveguide interconnect 102 of the illustrated example defines a first channel 118a (e.g., a first communication pathway) and a second channel 118a (e.g., a second communication pathway). Specifically, the first channel 118a enables signal propagation (e.g., carries signals) between the first signal launcher 114a of the first semiconductor die 104a and the third signal launcher 114c of the second semiconductor die 104b. In the illustrated example, the first signal launcher 114a is communicatively paired with the third signal launcher 114c via the first channel 118a. As shown in FIG. 1A, the first signal launcher 114a is positioned laterally (e.g., spaced horizontally) relative to the third signal launcher 114c and, thus, the first channel 118a extends in a sideways (e.g., horizontal) direction to span a distance (e.g., a horizontal distance) between the first signal launcher 114a and the third signal launcher 114c.

The second channel 118b of the illustrated example enables signal propagation (e.g., carries signals) between the second signal launcher 114b of the first semiconductor die 104a and the fourth signal launcher 114d of the second semiconductor die 104b. In the illustrated example, the second signal launcher 114b is communicatively paired with the fourth signal launcher 114d via the second channel 118b. As shown in FIG. 1B, the second signal launcher 114b is positioned laterally relative to the fourth signal launcher 114d and, thus, the second channel 118b extends in a sideways (e.g., horizontal) direction to span a distance (e.g., a horizontal distance) between the second signal launcher 114b and the fourth signal launcher 114d.

The first channel 118a defined by the waveguide interconnect 102 provides a first dedicated communication channel or pathway to carry or transmit (e.g., and isolate or confine) propagating signals between the first and third signal launchers 114a, 114c in the first channel 118a. Similarly, the second channel 118b defined by the waveguide interconnect 102 provides a second dedicated communication channel or pathway to carry or transmit (e.g., and isolate or confine) propagating signals between the second and fourth signal launchers 114b, 114d in the second channel 118b. In some examples, the first channel 118a communicatively couples one or more signal launchers of the first semiconductor die 104a and one or more signal launchers of the second semiconductor die 104b. Thus, for example, the first channel 118a can communicatively couple the first signal launcher 114a of the first semiconductor die 104a and a plurality of signal launchers 114 of the second semiconductor die 104b. In some examples, the second channel 118b communicatively couples one or more signal launchers 114 of the first semiconductor die 104a and one or more signal launchers 114 of the second semiconductor die 104b. Thus, for example, the second channel 118b can communicatively couple the fourth signal launcher 114d of the second semiconductor die 104b and a plurality of signal launchers 114 of the first semiconductor die 104a.

The first channel 118a and the second channel 118b of the illustrated example have a straight profile (e.g., a horizontal or lateral profile in the orientation of FIGS. 1A and 1B). For example, the first channel 118a and the second channel 118b of the illustrated example connect the closest edges of the respective first semiconductor die 104a and the second semiconductor die 104b. However, in some examples, the first channel 118a and/or the second channel 118b can be formed to communicatively couple any other edges (e.g., opposing edges) of the respective first semiconductor die 104a and the second semiconductor die 104b. However, in some examples, the channels 118 (e.g., the first channel 118a and/or the second channel 118b) can have an angled profile, a zig-zag profile, a diagonal profile, and/or any other shape or profile to communicatively couple a first signal launcher of a first semiconductor die and a second signal launcher of a second semiconductor die via a discrete or dedicated pathway.

To define a boundary or perimeter of the channels 118, the waveguide interconnect 102 of the illustrated example includes the plurality of through substrate vias (TSVs) 126. In other words, the waveguide interconnect 102 of the illustrated example has a plurality of TSVs 126 that surround and define (e.g., in an x-y plane looking down from above as shown in FIG. 1B) one or more discrete or dedicated channels 118. More specifically, the TSVs 126 of the illustrated example are positioned in a pattern around a portion (e.g., a portion 103a) of the standoff substrate 102a to define a boundary of a communication channel formed in the waveguide interconnect 102. Thus, a portion of the standoff substrate between any annular array (e.g., or pattern) of the TSVs 126 defines a channel 118. The TSVs 126 of this example are vertically arranged or oriented (e.g., traverse through the standoff substrate 102a in the z-direction of FIG. 1A) and together define a perimeter of hollow columns in the standoff substrate 102a around one or more channels 118. The channels 118 are oriented in one or more x-y planes of FIG. 1B.

The waveguide interconnect 102 of FIGS. 1A and 1B includes a plurality of first TSVs 126a to define (e.g., a boundary or perimeter of) the first channel 118a and a plurality of second TSVs 126b to define (e.g., a boundary or perimeter of) the second channel 118b. In the illustrated example, the first channel 118a and the second channel 118b share a plurality of shared TSVs 126c (e.g., a channel spacer or separator) that separates the first channel 118a and the second channel 118b.

In the illustrated example, a first portion 103a of the standoff substrate 102a surrounded, enclosed, or otherwise encircled by the first TSVs 126a and the shared TSVs 126c form the first channel 118a (e.g., a first rectangular shaped channel). The first TSVs 126a and the shared TSVs 126c are positioned in a pattern that defines a perimeter or boundary of the first portion 103a (i.e., the first channel 118a).

Likewise, a second portion 103b of the standoff substrate 102a surrounded, enclosed or otherwise encircled by the second TSVs 126b and the shared TSVs 126c (i.e., the TSVs 126c between both channels 118a, 118b) form the second channel 118b (e.g., a second rectangular shaped channel). The second TSVs 126b and the shared TSVs 126c are positioned in a pattern that defines a perimeter or boundary of the second portion 103b (i.e., the second channel 118a).

However, in some examples, the first and second channels 118a, 118b are formed without use of the shared TSVs 126c. In some such examples, the first channel 118a is formed with a first plurality of dedicated TSVs 126 to define a shape (e.g., a rectangular shape) of the first channel 118a and the second channel 118b is formed with a second plurality of dedicated TSVs 126 to define a shape (e.g., a rectangular shape) of the second channel 118b. For example, the shared TSVs 126c can be formed as two juxtaposed or separate rows of TSVs 126.

The channels 118 of the illustrated each define a channel width 128 in the y-direction, a channel length 130 in the x-direction, and a channel thickness 132 in the z-direction. For example, the channel width 128 of the first channel 118a is defined between the first TSVs 126a and the shared TSVs 126c. Likewise, the channel width 128 of the second channel 118b of the illustrated example is defined between the second TSVs 126*b* and the shared TSVs 126*c*. In some examples, a dimensional footprint (e.g., a channel length, a channel width, a channel thickness) of the first channel 118*a* and/or the second channel 118*b* depends on a dielectric constant of the standoff substrate 102*a* employed and the frequency of signals to be transmitted through the first channel 118*a* and/or the second channel 118*b* during operation. The channel length 130 of the channels 118 is defined by a distance between the signal launchers 114*a-d* to be communicatively coupled. The channel thickness 132 of the illustrated example defines a distance or space between the third semiconductor die 104*c* and the first and second semiconductor dies 104, 104*b*. In some examples, the channel thickness 132 is adjusted (e.g., increased or decreased) depending on signal strength (e.g. channel insertion loss) and/or whether the channels 118 require isolation from the third semiconductor die 104*c*.

The TSVs 126 of the illustrated example are hollow bores and have a circular cross-sectional shape. However, in some examples, one or more of the TSVs 126 has a square shape, an elongated shape, an oblong shape, a rectangular shape and/or any other shape and/or dimension. In the illustrated example, TSVs 126 are formed between a first end of the standoff substrate 102*a* adjacent the first and second backend layers 108*a*, 108*b* of the first and second semiconductor dies 104*a*, 104*b* and a second end of the standoff substrate 102*a* adjacent or proximate the third backend layer 108*c* of the third semiconductor die 104*c*. In the illustrated example, the TSVs 126 extend through an entirety of the substrate thickness 120 (i.e., in the z-direction) of the standoff substrate 102*a*. However, in some examples, one or more of the TSVs 126 can extend partially through the standoff substrate 102*a* in the z-direction (e.g., a distance that is less than the substrate thickness 120).

The TSVs 126 of the illustrated example can be hollow (e.g., unfilled, empty). In some examples, one or more of the TSVs 126 can be filled with a gas (e.g., air) or a low-k material to define a dielectric waveguide. In some examples, at least some of the TSVs 126 are filled with metal or coated with a metallic material. In some examples, one or more of the TSVs 126 can be filled with a material or dielectric material (e.g., air) having a lower dielectric constant (Dk) compared to a dielectric constant of the standoff substrate (e.g., silicon or glass). For example, the standoff substrate 102*a* can have a dielectric constant (Dk) of 4 and the TSVs 126 can be filled with a low-k material having a dielectric constant (Dk) of 1.

The TSVs 126 of the illustrated example are positioned in rows and columns along an x-y direction of the cartesian coordinate system as shown in FIG. 1B and extend along a z-direction of the cartesian coordinate system as shown in FIG. 1A. Additionally, the TSVs 126 have a TSV pitch 134 that isolates the signals in the channels 118. The TSV pitch 134 may be selected (e.g., increased or decreased) to have any desired TSV pitch suitable to the application. As used herein, TSV pitch 134 is defined as a distance or gap between two adjacent TSVs (e.g., in the x-direction and/or the y-direction). Additionally, the TSVs 126 can have aspect ratios of, for example, 20:1, 40:1 and/or any other desired aspect ratios. The TSV aspect ratio as used herein is a ratio between a height (e.g., in the z-direction) of a TSV and a diameter of a TSV. Thus, example TSVs 126 disclosed herein can have a height of between approximately 10 micrometers and 400 micrometers, and a diameter of between approximately 2 micrometers and 100 micrometers. In some examples, the TSVs 126 can be coated or lined with a metallic material. Although dimensions and orientations of the TSBs 126 and other structures herein are explained in the context of an x, y, z coordinate system oriented to FIGS. 1A and 1B, this is simply for illustrative purposes only. The TSVs 126 and/or any other structure may have different orientation, skews and/or imperfections as are to be expected in a real world fabrication process.

The example semiconductor package 100 of the illustrated example provides a near-monolithic package. For instance, each of the semiconductor dies 104 of the illustrated example can be formed independently and/or separately from formation of the waveguide interconnect 102. After formation of all the components, the third semiconductor die 104*c* of the illustrated example is coupled or joined to a first edge 102*c* of the standoff substrate 102*a* via, for example, hybrid bonding manufacturing technique(s). Additionally, the first semiconductor die 104*a* and the second semiconductor die 104*b* are coupled or jointed to a second edge 102*d* of the standoff substrate 102*a* opposite the first edge 102*c* via, for example, hybrid bonding manufacturing technique(s). Thus, although the components of the semiconductor package 100 of the illustrated example are formed on different wafers, the semiconductor package 100 has a near-monolithic configuration when the semiconductor package 100 is assembled as the result of the hybrid bonding between the semiconductor dies 104 and the waveguide interconnect 102. In the example of FIGS. 1A and 1B, the waveguide interconnect 102 is sandwiched between the semiconductor dies 104*a* 104*b* and the semiconductor die 104*c*.

The waveguide interconnect 102 (e.g., the standoff substrate 102*a* and the TSVs 126) of the illustrated example can be formed via etching, mechanical abrasion, laser ablation, and/or any other known semiconductor manufacturing technique(s). In some examples, the waveguide interconnect 102 can include an electrically conductive layer (e.g., which may include vias, trenches, walls, etc.) formed in a dielectric material using deposition or application technology including, but not limited to, photolithography, plating, electro-less plating, electrolytic plating, lamination, deposition techniques (such as atomic layer deposition or chemical vapor deposition), or similar techniques. In some implementations, all or a portion of the TSVs 126 may be formed via etching, mechanical abrasion, laser ablation, or similar material removal techniques. In some examples, all or a portion of the signal launchers 114*a-d* can be formed at least partially inside or internal to the waveguide interconnect 102. In some implementations, the signal launchers 114*a-d* can be formed using photolithography, etching, edge plating, plating, electro-less plating, electrolytic plating, deposition technologies, or combinations thereof in a location within the standoff substrate 102*a* proximate an edge to couple with the backend layers 108. For example, the signal launchers 114*a-d* may be etched, photolithographically formed, or deposited at least partially within an internal space formed by the waveguide interconnect 102.

In some examples, the third semiconductor die 104*c* is communicatively and/or electrically coupled to the first semiconductor die 104*a* and/or the second semiconductor die 104*b* via one or more traces, vias, and/or any other electronic components. For example, the waveguide interconnect 102 of the illustrated example include one or more metallic vias to communicatively and/or electrically couple the third semiconductor die 104*c* and the first semiconductor die 104*a* and/or the third semiconductor die 104*c* and the second semiconductor die 104*b*. In some examples, the waveguide interconnect 102 can include one or more metallic vias extending at least partially through the waveguide interconnect 102 to provide power, ground, electrical shielding, etc., to the first semiconductor die 104a and/or the second semiconductor die 104b. Additionally, in some examples, the first semiconductor 104a is communicatively coupled with the second semiconductor 104b via one or more traces and/or other electronic components formed in, for example, the backend layers 108a, 108b, the standoff substrate 102a and/or any other component.

The die layers 106 and the backend layers 108 can be coupled together by, for example, on or more interconnects including, but not limited to, metal-to-metal bonds, copper pillars, vias, solder, and/or any other type of interconnect that allows physical coupling and/or electrical communication between the die layers 106 and the respective backend layers 108. Additionally, in some examples, the waveguide interconnect 102 includes one or more of the communications and/or electrical traces that would otherwise be supported by the backend layers 108. In this manner, the waveguide interconnect 102 can alleviate component density of the backend layers 108, thereby simplifying manufacturing and/or improving performance of the semiconductor dies 104.

In operation, the waveguide interconnect 102 of the illustrated example enables bidirectional communication of a first signal 138a between the first semiconductor die 104a and the second semiconductor die 104b via the first channel 118a and enables bidirectional communication of a second signal 138b between the first semiconductor die 104a and the second semiconductor die 104b via the second channel 118b.

For example, in a transmit mode, the logic circuit(s) 110a-d generate one or more signals containing information and/or data. The transceivers 112a-d receives the one or more signals from the logic circuit(s) 110a-d and modulates the signals into high-frequency carrier signals. The signal launcher 114a-d launches or sends the high-frequency modulated carrier signals containing the information and/or data into the channels 118 of the waveguide interconnect 102.

In a receive mode, the signal launchers 114a-d receive the high-frequency modulated carrier signals containing the information and/or data from the waveguide interconnect 102. The transceivers 112a-d demodulate the one or more signals detected by the signal launchers 114a-d for processing by the logic circuits(s) 110a-d.

For example, the first logic circuit 110a of the first semiconductor die 104a generates signals containing information and/or data. The first transceiver 112a modulates the signals into the first signal 138a (e.g., a first high-frequency carrier signal). The first signal launcher 114a launches the first signal 138a at a first end of the first channel 118a of the waveguide interconnect 102. The first signal 138a propagates through and/or across the first channel 118a and is received by the third transceiver 112c at a second end of the first channel 118a opposite the first end. The third signal launcher 114c receives the first signal 138a, where the third transceiver 112c demodulates the first signal 138a for use by the third logic circuit 110c. The operation can be reversed where the third logic circuit 110c generates the first signal 138a and the first logic circuit 110a receives and/or processes the first signal 138a.

Similarly, the fourth logic circuit 110d of the second semiconductor die 104b generates signals containing information and/or data. The fourth transceiver 112d modulates the signals into the second signal 138b (e.g., a second high-frequency carrier signal). The fourth signal launcher 114d launches the second signal 138b at a first end of the second channel 118b of the waveguide interconnect 110. The second signal 138b propagates through and/or across the second channel 118b and is received by the second transceiver 112b at a second end of the second channel 118b opposite the first end. The second signal launcher 114b receives the second signal 138b, and the second transceiver 112b demodulates the second signal 138b for use by the second logic circuit 110b. The operation can also be reversed where the second logic circuit 110b generates the second signal 138b and the fourth logic circuit 110d receives and/or processes the second signal 138b.

The first signal 138a and the second signal 138b can propagate in (e.g. or are carried by) the respective first and second channels 118a, 118b simultaneously (e.g., at the same time) or at different times. The first signal 138a in the first channel 118a is isolated from the second channel 118b when the first signal 138a propagates in the first channel 118a between the TSVs 126a and 126c, and the second signal 138b in the second channel 118b is isolated from the first channel 118a when the second signal 138b propagates in the second channel 118b between the TSVs 126b and 126c. In other words, the TSVs 126 surrounding the first channel 118a confine or contain the first signal 138a in the first channel 118a and prevent or restrict signal loss outside of a perimeter or boundary defined by the first channel 118a (e.g., the TSVs 126 of the first channel 118a). Likewise, the TSVs 126 surrounding the second channel 118b confine or contain the second signal 138b in the second channel 118b and prevent or restrict signal loss outside of a perimeter or boundary defined by the TSVs 126 of the second channel 118b. Thus, the first signal 138a does not interfere with the second signal 138b, and the second signal 138b does not interfere with the first signal 138a when the signals propagate in the respective first and second channels 118a, 118b. Thus, in operation, as the first signal 138a propagates in the first channel 118a and the second signal 138b propagates in the second channel 118b, the first channel 118a insulates or isolates the first channel 118a and the second channel insulates or isolates the second signal 138b to prevent crosstalk and/or interference between the first signal 138a in the first channel 118a and the second signal 138b in the second channel 118b.

Additionally, the substrate thickness 120 of the illustrate example is sufficient to prevent or restrict interference (e.g., electromagnetic interference) from and/or to the third semiconductor die 104c. Thus, the first channel 118a confines the first signal 138a within the boundary or perimeter defined by the TSVs 126 (e.g., the first TSVs 126a and the shared TSVs 126c) and provides an effective medium channel that acts as a short and low loss dielectric substrate integrated waveguide channel. The second channel 118b confines the second signal 138b within the boundary or perimeter defined by the TSVs 126 (e.g., the second TSVs 126b and the shared TSVs 126c) and provides an effective medium channel that acts as a short and low loss dielectric substrate integrated waveguide channel.

The number of TSVs 126 (and/or the shape of the TSVs) can be chosen based on the application to restrict or prevent crosstalk and/or interference between neighboring channels 118. For example, the number of rows, columns and/or pitch defining a channel 118 can be adjusted (e.g., increase or decrease) to reduce crosstalk and/or interference between neighboring or adjacent channels 118. For instance, the first TSVs 126a of the illustrated example can include two or more rows and the shared TSVs 126c can include two or more rows to reduce (e.g., eliminate or prevent) crosstalk or interference when the first signal 138a propagates in the first channel 118a and the second signal 138b propagates in the second channel 118b.

Figure 2B:
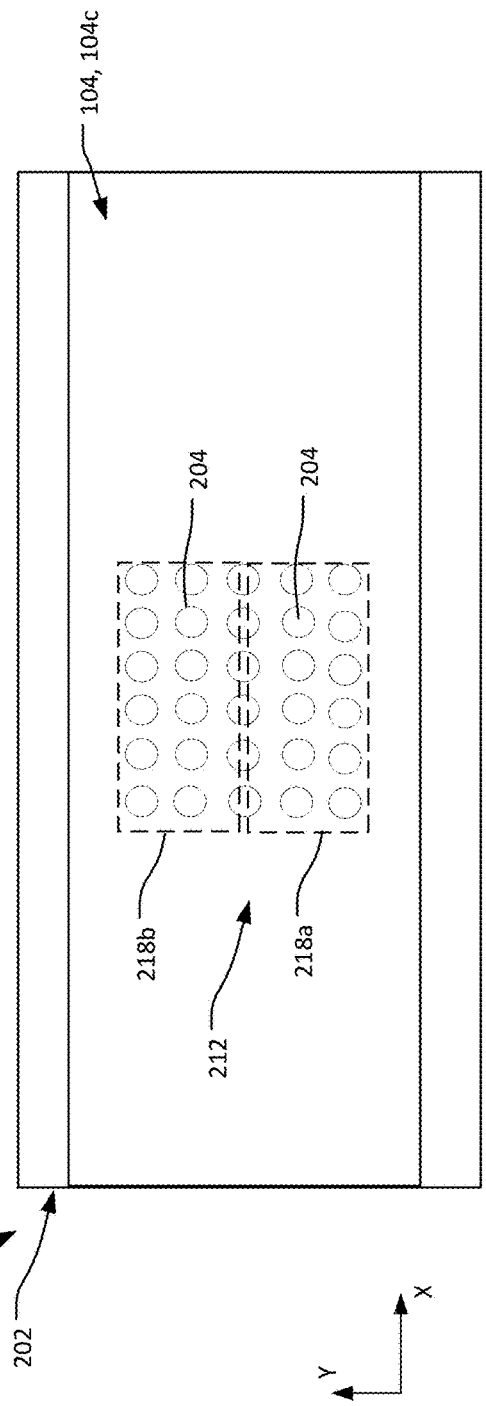
FIG. 2B is a bottom, partially transparent view of the example semiconductor package of FIG. 2A.

FIG. 2A is a cross-sectional view of an example semiconductor package 200 including another example waveguide interconnect 202 disclosed herein. FIG. 2B is a bottom, partially transparent view of the example semiconductor package 200 of FIG. 2A. Many of the components of the example semiconductor package 200 of FIGS. 2A and 2B are substantially similar or identical to the components described above in connection with the semiconductor package 100 of FIGS. 1A and 2B. As such, those components will not be described in detail again below. Instead, the interested reader is referred to the above corresponding descriptions for a complete written description of the structure and operation of such components. To facilitate this process, similar or identical reference numbers will be used for like structures in FIGS. 2A and 2B as used in FIGS. 1A and 2B. For example, the semiconductor package 200 of FIGS. 2A and 2B include a plurality of semiconductor dies 104 including a first semiconductor die 104a, a second semiconductor die 104b and a third semiconductor die 104c.

The waveguide interconnect 202 of FIGS. 2A and 2B is positioned between the third semiconductor die 104c and the first and second semiconductor dies 104a, 104b. The waveguide interconnect 202 of the illustrated example is substantially similar to the waveguide interconnect 102 of FIGS. 1A and 1B. For example, the waveguide interconnect 202 of the illustrated example includes a plurality of TSVs 126 (e.g., shown only in FIG. 2A) that define one or more channels 218 (e.g., a first channel 218a, a second channel 218b) (shown schematically in FIG. 2B). The channels 218 of FIGS. 2A and 2B are substantially similar or identical to the channels 118 of FIGS. 1A and 1B.

In contrast to the waveguide interconnect 102 of FIGS. 1A and 1B, the waveguide interconnect 202 of the illustrated example includes a plurality of blind TSVs 204. The blind TSVs 204 of the illustrated example are formed along an edge 206 of the waveguide interconnect 202 positioned approximate and/or configured to engage with the third semiconductor die 104c. Additionally, the blind TSVs 204 partially extend in the waveguide interconnect 202 in the z-direction. For instance, the TSVs 126 have a length 208 that is greater than a length 210 of the blind TSVs 204. Thus, the blind TSVs 204 terminate within the waveguide interconnect 202.

The blind TSVs 204 of the illustrated example are formed in an array 212 that overlap and/or encompass (e.g., a perimeter of) the first channel 218a and (e.g., a perimeter of) the second channel 218b. In operation, the blind TSVs 204 of the illustrated example confine a signal 238 (e.g., the first signal 138a or the second signal 138b of FIGS. 1A and 1B) in the z-direction. In other words, the blind TSVs 204 isolate the signal 238 in the channel 218 from crosstalk and/or interference from the third semiconductor die 104c (e.g., a third backend layer 108c or active side of the third semiconductor die 104c). In some examples, the blind TSVs 204 enable the waveguide interconnect 202 to be formed with a smaller thickness 220 in the z-direction compared to the substrate thickness 120 of the waveguide interconnect 102 of FIGS. 1A and 1B without fear of signal interference, thereby enabling a smaller or lower profile semiconductor package. The blind TSVs 204 of the illustrated example can be hollow, empty, and/or filled with a solid material or gas (e.g., air).

Figure 3:
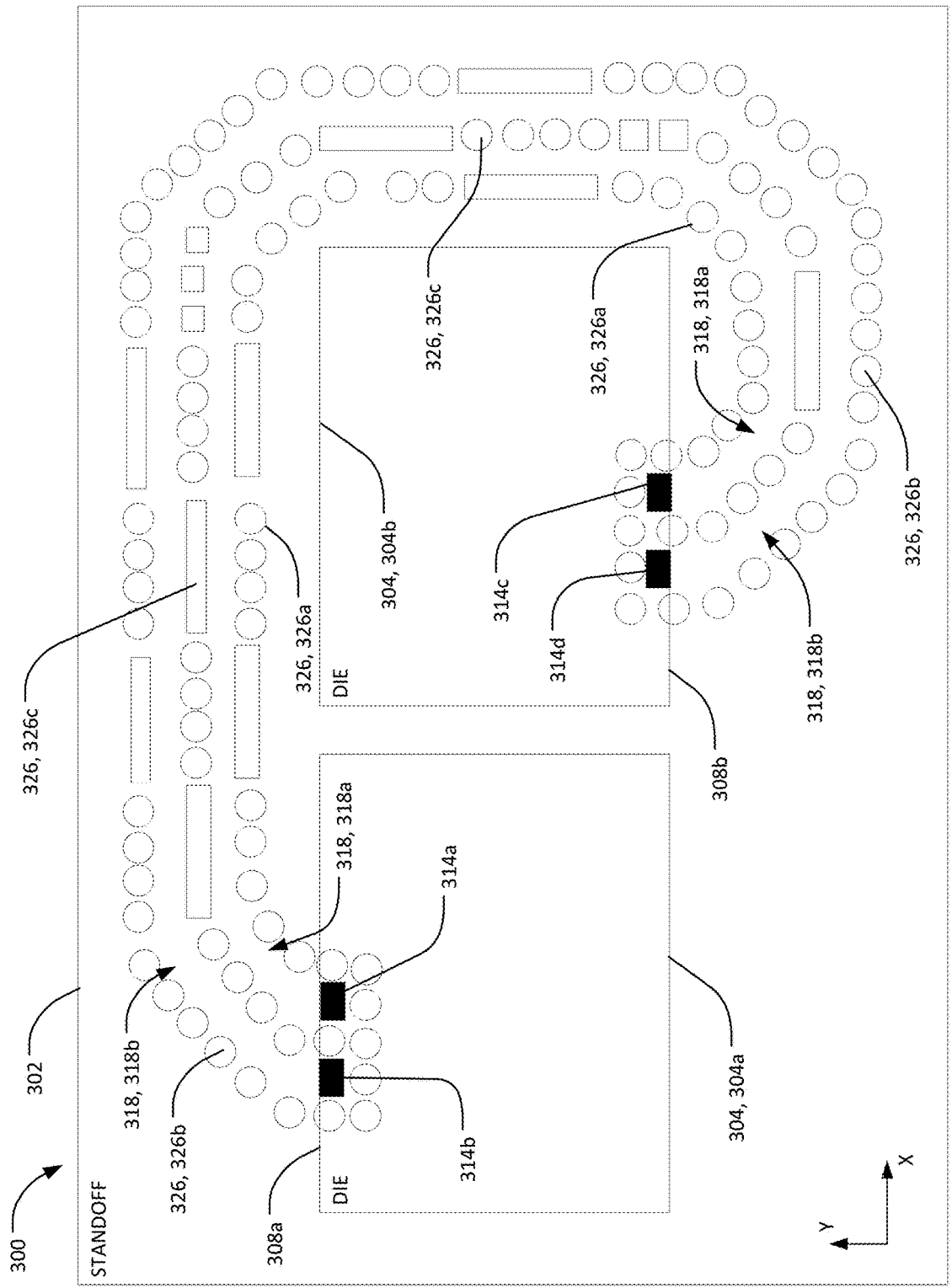
FIG. 3 is a top view of an example semiconductor package including another example waveguide interconnect disclosed herein.

FIG. 3 is a top view of an example semiconductor package 300 including another example waveguide interconnect 302 disclosed herein. The semiconductor package 300 of the illustrated example includes a plurality of semiconductor dies 304. For instance, the semiconductor package 300 of the illustrated example includes a first semiconductor die 304a (e.g., a first chiplet) and a second semiconductor die 304b (e.g., a second chiplet). Likewise, the first semiconductor die 304a and the second semiconductor die 304b of the illustrated example are coupled to the waveguide interconnect 302, which can couple to a semiconductor die (e.g., the third semiconductor die 104c of FIGS. 1A and 1B).

The first and second semiconductor dies 304a, 304b of the illustrated example can be constructed and/or can function substantially similar to the semiconductor dies 104a, 104b of FIGS. 1A and 1B. For instance, the first semiconductor die 304a and the second semiconductor die 304b include logic circuits (e.g., logic circuits 110a-d of FIGS. 1A and 1B) that generate and/or process signals and/or transceivers (e.g., the transceivers 112a-d of FIGS. 1A and 1B) that modulate, demodulate and/or transmit signals and/or information. To transmit the signals or information between the semiconductor dies 302a, 302b, the semiconductor package 300 of the illustrated example employs a plurality of signal launchers 314a-d (e.g., planar launchers). For example, the first semiconductor die 302a includes a first signal launcher 314a and a second signal launcher 314b and the second semiconductor die 304a includes a third signal launcher 314c and a fourth signal launcher 314d. (The signal launchers 314a-d may be the signal launchers 114a-d discussed above).

To carry or transmit the signals between signal launchers 314a-d of the first and second semiconductor dies 302a, 302b, the example semiconductor package 300 of the illustrated example employs the waveguide interconnect 302. Specifically, the waveguide interconnect 302 of the illustrated example includes a plurality of TSVs 326 (e.g., similar to the TSVs 126 of FIGS. 1A and 1B) that form a plurality of communication channels 318. In the illustrated example, the TSVs 326 form a first channel 318a and a second channel 318b. For example, to define (e.g., a boundary or perimeter of) the first channel 318a and (e.g., a boundary or perimeter of) the second channel 318b, the waveguide interconnect 302 of the illustrated example includes a plurality of first TSVs 326a (e.g., a first row of the TSVs 326), a plurality of second TSVs 326b (e.g., a second row of the TSVs 326), and a plurality of shared TSVs 326c (e.g., a third row of the TSVs 326). In this example, the shared TSVs 326c are positioned between the first TSVs 326a and the second TSVs 326b. Thus, the first channel 118a and the second channel 118b share a plurality of shared TSVs 326c (e.g., a channel spacer) that separate the first channel 318a and the second channel 318b.

The first channel 318a and the second channel 318b have an arcuate or ring shape (e.g., a non-straight path unlike those shown in FIGS. 1A and 1B). For instance, the arcuate or ring shape to extends a first distance in the x-direction and a second distance in the y-direction to form, for example, a race-track like shape, a J-like profile, a U-like profile, an O-like profile etc. In this example, the channels 318 communicatively couple the signal launchers 314a-b located on a first edge 308a of the semiconductor die 304a and the signal launchers 314c-d located on a second edge 308b of the second semiconductor die 304b opposite the first edge 308a, where the first edge 308a is oriented in a direction away from a direction of the second edge 308b. Thus, irrespective of the shape of the channels 318, the channels 318 efficiently carry or propagate signals between the signal launchers 314a-d.

In the illustrated example, the channels 118 at least partially encompass or surround a first edge of the first semiconductor die 304a and the channels 118 at least partially encompass or surround at three different edges of the second semiconductor die 304a (e.g., the channels 118 wrap around a portion of the second semiconductor die 304b), In other words, the channels 118 can be formed with any shape or profile to communicatively couple the semiconductor dies 304a and 304b. For instance, the first channel 318a can be formed as shown in FIG. 3 and the second channel 318b can be formed or routed in a different direction (e.g., an opposite direction) such that the second channel 318b at least partially encompasses or surrounds three edges of the first semiconductor die 304a and a first edge of the second semiconductor die 304b.

To provide or define a shape of the channels 318, the TSVs 326 of the illustrated example are positioned at various locations in the x-y direction of the cartesian coordinate system as shown in FIG. 3 (e.g., and also extend along a z-direction of the cartesian coordinate system as shown, for example, in FIG. 1A). For example, the first TSVs 326a are positioned along the x-direction and the y-direction to define a first edge or wall (e.g., an insulator or isolation wall) of the first channel 318a, the second TSVs 326b are positioned along the x-direction and the y-direction to define a second edge or wall (e.g., an insulator or isolation wall) of the second channel 318b, and the shared TSVs 326c are positioned along the x-direction and the y-direction to define a common edge or wall (e.g., an insulator or isolation wall) between the first wall and the second wall.

In the illustrated example, the first TSVs 326a and the shared TSVs 326c form a shape or boundary of the first channel 318a, and the second TSVs 326b and the shared TSVs 326c form a shape or boundary of the second channel 318b. However, in some examples, the first and second channels 318a, 318b can be formed without use of the shared TSVs 326c. For example, the first channel 318a can be formed with a first plurality of dedicated TSVs 326 to define a shape or boundary of the first channel 318a and the second channel 318b can be formed with a second plurality of dedicated TSVs 326 to define a shape or boundary of the second channel 318b.

The first channel 318a of the waveguide interconnect 302 of the illustrated example communicatively couples a first signal launcher 314a of the first semiconductor 304a and a third signal launcher 314c. The second channel 318b of the waveguide interconnect 302 of the illustrated example communicatively couples a second signal launcher 314b of the first semiconductor 304a and a fourth signal launcher 314d of the second semiconductor die 304b. The channels 318 function similarly or identical to the channels 118 of FIGS. 1A and 1B and the operation is not repeated here for brevity.

TSVs 326 of the illustrated example include TSVs 326s have a square profile, a circular profile, and a rectangular profile. In some examples, the TSVs 326 can have an elongated shape, an oblong shape, a combination thereof, and/or any other shape and/or dimension. Additionally, the TSVs 326 have a pitch sufficient to isolate the signals in the channels 318 and/or can have any desired pitch. The one or more of the TSVs 326 of the illustrated example can be hollow or unfilled (e.g., empty), or filled with a gas (e.g., air) or a low-k material. In some examples, one or more of the TSVs 326 can be filled with a material or dielectric material (e.g., air) having a lower dielectric constant (Dk) compared to a dielectric constant of the waveguide interconnect (e.g., silicon or glass). In some examples, one or more of the TSVs 326 can be filled or coated or lined with a metallic material.

Figure 4:
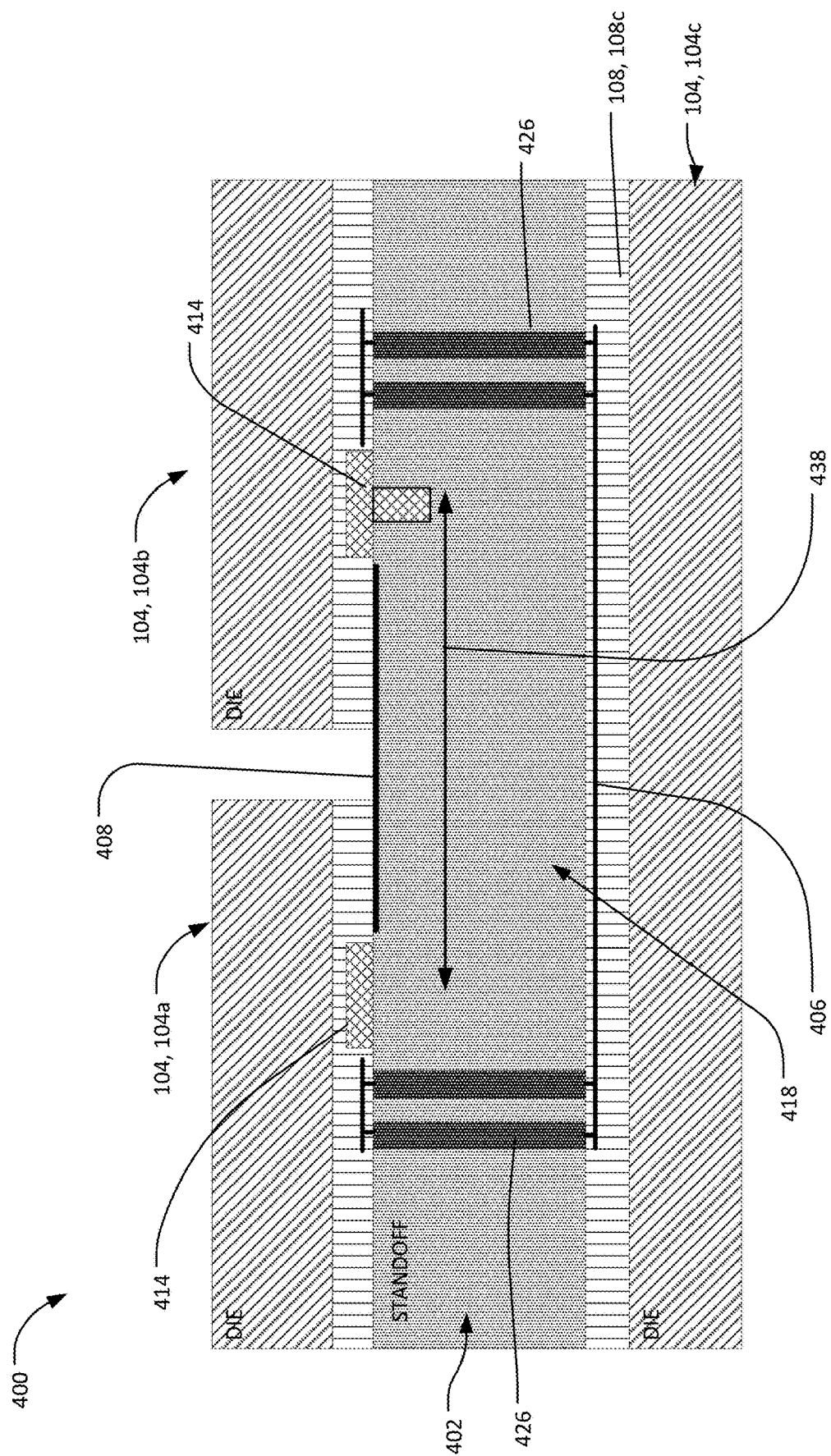
FIG. 4 is a cross-sectional view of an example semiconductor package including another example waveguide interconnect disclosed herein.

FIG. 4 is a cross-sectional view of example semiconductor package 400 including another example waveguide interconnect 402 disclosed herein. Many of the components of the example semiconductor package 400 of FIG. 4 are substantially similar or identical to the components described above in connection with the semiconductor package 100 of FIGS. 1A and 1B. As such, those components will not be described in detail again below. Instead, the interested reader is referred to the above corresponding descriptions for a complete written description of the structure and operation of such components. To facilitate this process, similar or identical reference numbers will be used for like structures in FIG. 4 as used in FIGS. 1A and 1B. For example, the semiconductor package 400 of FIG. 4 include a plurality of semiconductor dies 104 including a first semiconductor die 104a, a second semiconductor die 104b and a third semiconductor die 104c.

The waveguide interconnect 402 of FIG. 4 is substantially similar to the waveguide interconnect 102 of FIGS. 1A and 1B except the waveguide interconnect 402 of FIG. 4 employs TSVs 426 to define a channel 418 (the first channel 118a and/or the second channel 118b of FIGS. 1A and 1B). Specifically, the TSVs 426 of the illustrated example are metal filled vias that electrically couple the first semiconductor die 104a and the third semiconductor die 104c, and electrically couple the second semiconductor die 104b and the third semiconductor die 104c. For example, the TSVs 426 electrically couple the first semiconductor die 104a and the second semiconductor die 104b to a ground plane 406 formed in the third backend layer 108c of the third semiconductor die 104c.

A standoff substrate 402a of the waveguide interconnect 402 and the TSVs 426 define the channel 418 to enable electromagnetic communication (RF signal) transmission between launchers 114 of the first and second semiconductor dies 104a, 104b. Although the TSVs 426 are metallic filed vias, the TSVs 426 define a boundary for the channel 418 along which a signal 438 can propagate between the semiconductor dies 104a, 104b. Additionally, when the semiconductor package 400 is formed via, for example, hybrid bonding, a ground 408 can be formed on an edge interface 410 of the standoff substrate 402a.

In operation, the channel 418 provides a horizontal channel defined by metallic TSVs paired with on-die planar launchers 414 and utilizes ground planes (the ground plane 406 and the ground 408) on the backend layers 108 and/or the standoff substrate 402a. The waveguide interconnect 402 of the illustrated example provides a metallic substrate integrated waveguide. Although the metallic filled TSVs 426 can increase overall insertion loss, the channel 418 can be used to contain or isolate (e.g., prevent crosstalk) signals in a lower mm-Wave frequencies (e.g., signals having frequencies less than 300 GHz). The ground plane 406 of the third backend layer 108c can be used to control impedance when providing isolation levels defined by the channel 418. Additionally, a length of the channel 418 can be adjusted (e.g., shortened) to accommodate higher frequency signals.

Figure 5A:
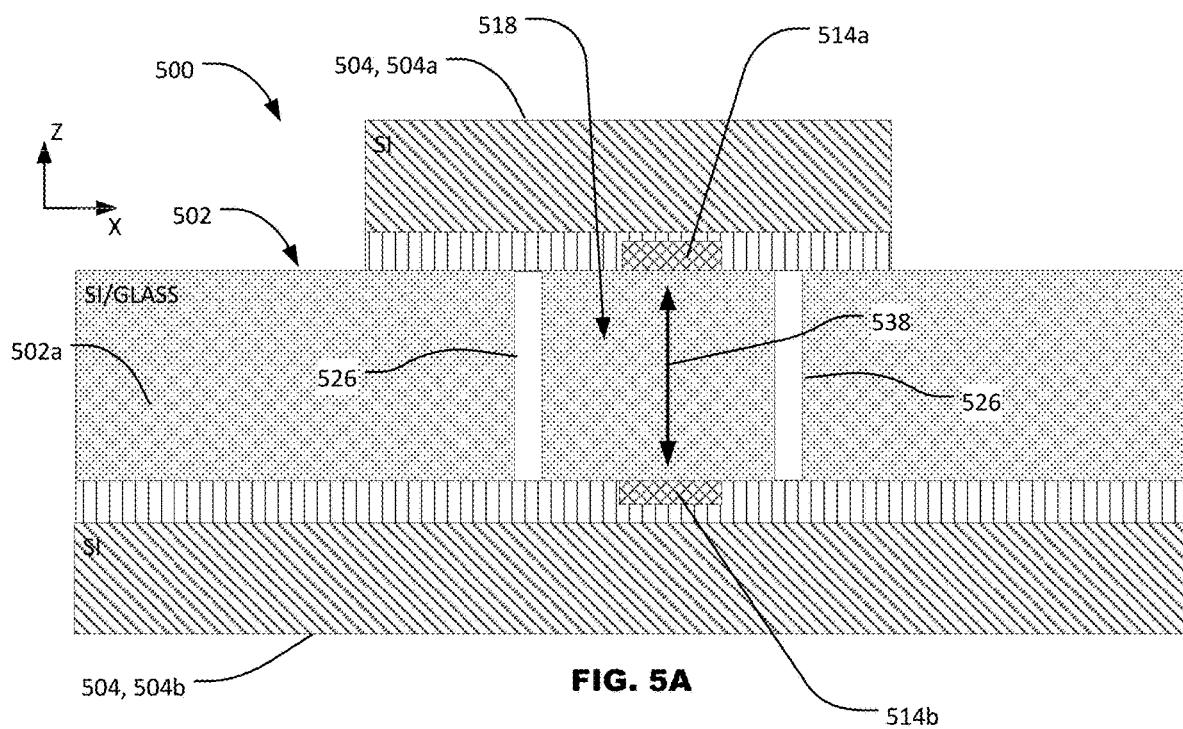
FIG. 5A is a cross-sectional view of an example semiconductor package including another example waveguide interconnect disclosed herein.
Figure 5B:
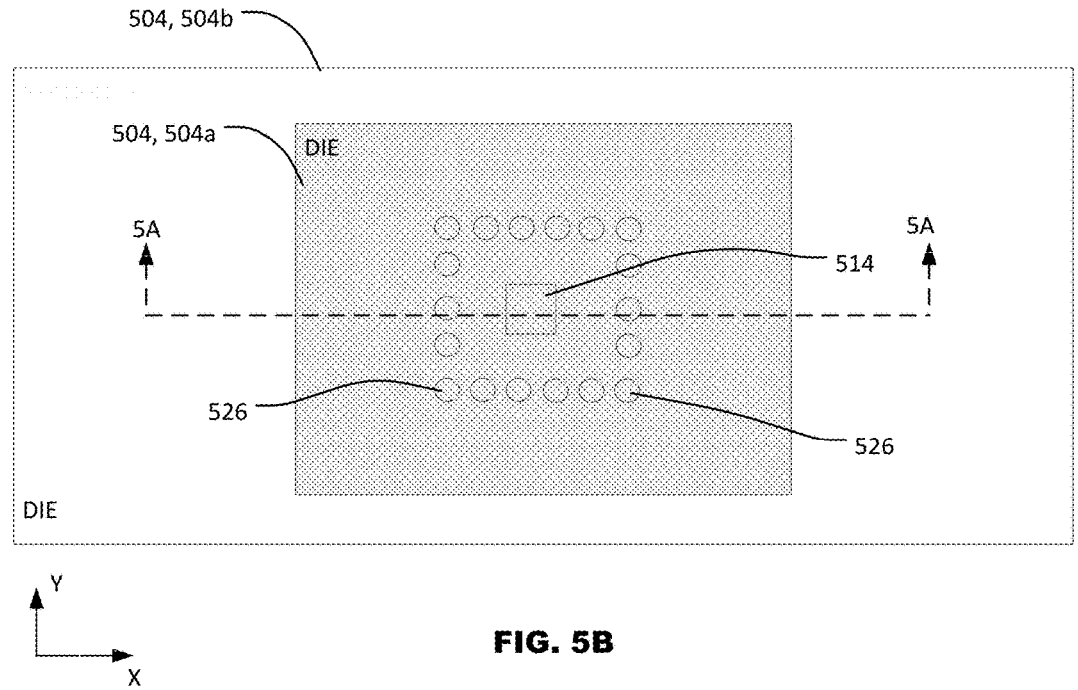
FIG. 5B is a top, partially transparent view of the example semiconductor package of FIG. 5A.

FIG. 5A is a cross-sectional view of an example semiconductor package 500 including another example waveguide interconnect 502 disclosed herein FIG. 5B is a top, partially transparent view of the example semiconductor package 500 of FIG. 5A. The semiconductor package 500 of the illustrated example includes a plurality of semiconductor dies 504. For example, the semiconductor package 500 of the illustrated example includes a first semiconductor die 504a (e.g., a chiplet) and a second semiconductor die 504b (e.g., abase die) The first semiconductor die 504a is substantially similar to the first semiconductor die 104a of FIGS. 1A and 1B. For example, the first semiconductor die 504a includes a die layer 506a, a backend layer 508a, and a first signal launcher 514a (e.g., a planar launcher). The second semiconductor die 504b includes a die layer 506b, a backend layer 508b, and a second signal launcher 514b (e.g., a planar launcher). The first semiconductor die 504a and the second semiconductor die 504b can include logic circuits (e.g., the logic circuits 110a-d of FIGS. 1A and 1B), transceivers (e.g., the transceivers 112a-d of FIGS. 1A and 1B), and first and second signal launchers 514a, 514b (e.g., planar launchers).

To establish electromagnetic signal (RF signal) communication between the first semiconductor die 504a and the second semiconductor die 504b via the first and second signal launchers 514a, 514b, the semiconductor package 500 of the illustrated example employs the waveguide interconnect 502. For example, the waveguide interconnect 502 of the illustrated example includes a channel 518 (e.g., an isolated or discrete channel) between the first signal launcher 514a of the first semiconductor die 504a and the second signal launcher 514b of the second semiconductor die 504b. The first semiconductor 504a is spaced (e.g., vertically) from the second semiconductor die 504b. For example, the first signal launcher 514a is vertically spaced from the second signal launcher 514b.

To establish a boundary or perimeter of the channel 518, the waveguide interconnect 502 of the illustrated example employs a plurality of TSVs 526. The TSVs 526 are positioned along the y-direction and the x-direction to define a boundary of the channel 518. For example, the TSVs 526 of the illustrated example are positioned along the x-direction and the y-direction in a square shape or pattern. In this manner, the TSVs 526 and a portion 503 of the standoff substrate 502a that is surrounded, enclosed or encircled by the TSVs 526 define the channel 518. Specifically, in the illustrated example the first signal launcher 514a is positioned vertically relative to the second signal launcher 514b, and the communication channel 518 extends in a vertical direction to span a distance (e.g., in the z-direction) between the first signal launcher 514a and the second signal launcher 514b. In operation, the channel 518 enables signals to propagate between the first signal launcher 514a and the second signal launcher 514b and/or confines the signals 538 within the boundary defined by the TSVs 526 and/or restricts or prevents crosstalk or signal loss outside of the boundary defined by the TSVs 526.

The TSVs 526 extend (e.g., entirely) through a standoff substrate 502a of the waveguide interconnect 502 in the z-direction. The functional and/or structural aspects of TSVs 526 and/or the waveguide interconnect 502, including formation of the same, are similar as described above in connection with the description of the waveguide interconnect 102 and the TSVs 126 of FIGS. 1A and 1B. For instance, the TSVs 526 can be hollow, empty, and/or filled with a low-k dielectric material. In contrast with the channels 118 of FIGS. 1A and 1B, the channel 518 of the illustrated example defines a vertical channel. The semiconductor package 500 of the illustrated example can implement near-field communication structure.

Figure 6:
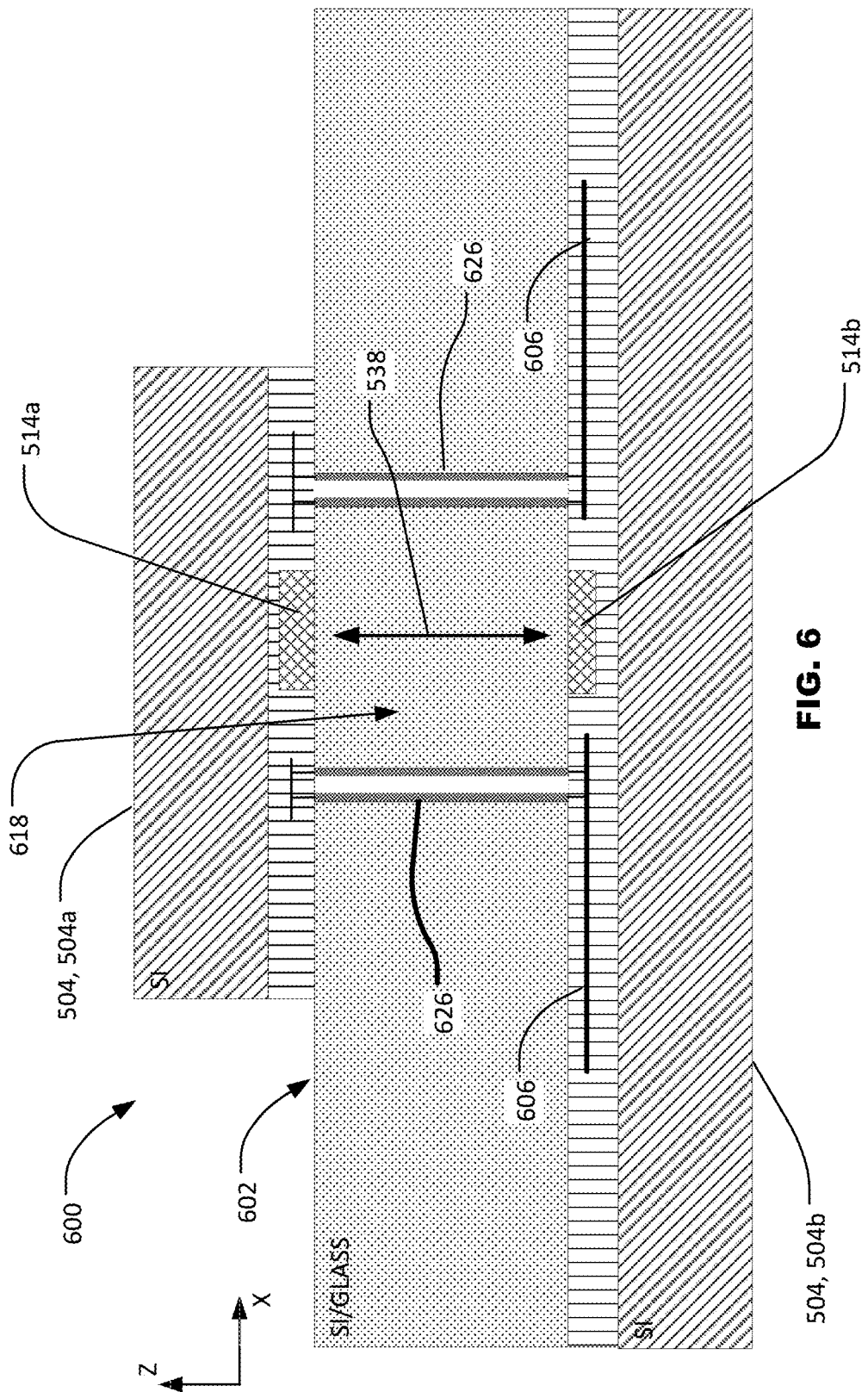
FIG. 6 is a cross-sectional view of an example semiconductor package including another example waveguide interconnect disclosed herein.

FIG. 6 is a cross-sectional view of an example semiconductor package 600 including another example waveguide interconnect 602 disclosed herein. Many of the components of the example semiconductor package 600 of FIG. 6 are substantially similar or identical to the components described above in connection with the semiconductor package 500 of FIGS. 5A and 5B. As such, those components will not be described in detail again below. Instead, the interested reader is referred to the above corresponding descriptions for a complete written description of the structure and operation of such components. To facilitate this process, similar or identical reference numbers will be used for like structures in FIG. 6 as used in FIGS. 5A and 5B. For example, the semiconductor package 600 of FIG. 6 include a plurality of semiconductor dies 504 including a first semiconductor die 504a and a second semiconductor die 504b.

The waveguide interconnect 602 of the illustrated example is substantially similar to the waveguide interconnect 502 of FIGS. 5A and 5B except the waveguide interconnect 602 of FIG. 6 includes TSVs 626. The TSVs 626 of the illustrated example are partially filed with a metallic material and/or are coated with a metallic or electrically conductive material. In this manner, the TSVs 626 of the illustrated example can be used to electrically couple the first semiconductor die 502a and the second semiconductor die 502d. For instance, the TSVs 626 can be used to define a channel 618 for electromagnetic (RF) communication transfer between the semiconductor dies 504a, 504b and can also be used to electrically couple the first semiconductor die 504a to a ground 606 of the second semiconductor die 504b. In some examples, the metal filled TSVs 626 can be formed with the example semiconductor package 500 of FIGS. 5A and 5B such that the metal filled TSVs 626 are positioned an outer perimeter of the TSVs 526, thereby enabling electrical communication between the semiconductor dies 504a and 504b and establishing a channel 518 (e.g., a robust channel) for RF communication or transmission. In other words, the TSVs 526 and the TSVs 626 can be formed as double wall structure to define the boundary of the channel. In some examples, the metal filled TSVs 626 can be implemented with any other example disclosed herein.

Figure 7A:
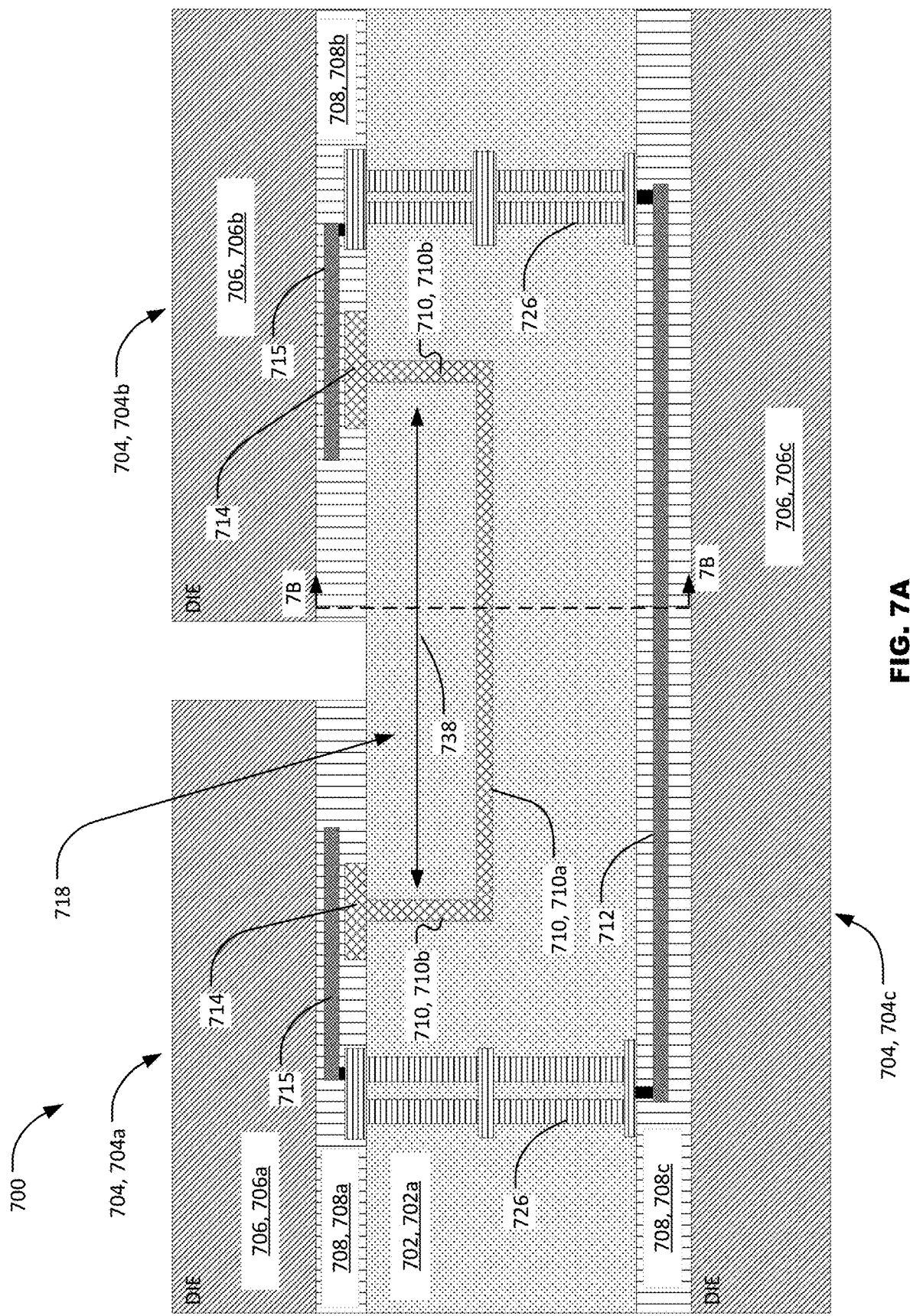

FIGS. 7A-7C illustrate an example semiconductor package 700 having another example waveguide interconnect 702 disclosed herein. FIG. 7A is a cross-sectional view the example semiconductor package 700. FIG. 7B is a front, cross-sectional view taken along line 7B-7B of FIG. 7A. FIG. 7C is an isometric view of a portion of the example semiconductor package 700 of FIGS. 7A and 7B. The semiconductor package 700 of the illustrated example includes a plurality of semiconductor dies 704 including a first semiconductor die 704a, a second semiconductor die 704b and a third semiconductor die 704c. The semiconductor dies 704 of the illustrated example can be similar to the semiconductor dies 104 of FIGS. 1A and 1B. For example, the semiconductor dies 704a-c include respective dies 706a-706c and backend layers 708a-708c.

The waveguide interconnect 702 includes a standoff substrate 702a that is positioned between the third semiconductor die 704c and the first and second semiconductor dies 704a, 704b. To communicatively and/or electrically couple the first semiconductor die 704a and the second semiconductor die 704b, the waveguide interconnect 702 of the illustrated example includes a communication channel 718. The channel 718 of the illustrated example is defined by the standoff substrate 702a and a transmission line 710. The transmission line 710 of the illustrated example can be a stripline, a coplanar waveguide, etc. The transmission line 710 of the illustrated example is formed of a metallic material or layer and physically couples one or more electrical or contact pads 714 (e.g., signal launchers, contact pads, etc.) of the first semiconductor die 704*a* and the second semiconductor die 704*b*. The transmission line 710 of the illustrated example includes a first portion 710*a* (e.g., a horizontal portion in the orientation of FIG. 7A) and second portions 710*b* (e.g., vertical portions in the orientation of FIG. 7A). The second portions 710*b* (e.g., vertical portions) couple the first portion 710*a* to the respective ones of the contact pads 714.

To electrically couple the semiconductor dies 704, the semiconductor package 700 of the illustrated example includes TSVs 726. The TSVs 726 are metal filled vias that extend (e.g., vertically) through the standoff substrate 702*a*. For example, a first TSV 726*a* electrically couples a ground plane 715 of the first semiconductor die 704*a* and a ground plane 712 of the third backend layer 708*c*. A second TSV 726*b* different from the first TSV 726*a* electrically couples a ground plane 715 of the second semiconductor die 704*b* and the ground plane 712 of the third backend layer 708*c*. In some examples, the cross-section of FIG. 7A illustrates or reveals a transmission line and ground planes on top and bottom dies.

Referring to FIGS. 7B and 7C, the transmission line 710 of the illustrated example is encased or surrounded by the standoff substrate 702*a*. In other words, the transmission line 710 (e.g., the first portion 710*a*) of the illustrated example is entirely surrounded by a material (e.g., a dielectric material) of the standoff substrate 702*a*. In other words, the transmission line 710 (e.g., the first portion 710*a*) is suspended (e.g., centrally embedded) in the standoff substrate 702*a* between the backend layers 708*a-b* of the respective semiconductor dies 704*a-b* and the third backend layer 708*c* of the third semiconductor die 704*c*.

In some examples, the transmission line 710 of the illustrated example can be configured to electrically couple the first semiconductor die 704*a* and the third semiconductor die 704*c*, or the second semiconductor die 704*b* and the third semiconductor die 704*c*. For example, one of the second portions 710*b* (e.g., the vertical portion) of the transmission line 710 can be routed to through the standoff substrate 702*a* and to the third backend layer 708*c* of the third semiconductor die 704*c*. Thus, the transmission line 710 can couple to semiconductor dies positioned on a first side of (e.g., above) the transmission line 710 and a semiconductor dies positioned on a second side of (e.g., below 0 the transmission line 710. In some examples, at least a portion of the transmission line 710 is encased with the standoff substrate 702*a*. In some examples, the transmission line 710 can be entirely encased within standoff substrate 702*a*.

Additionally, the semiconductor package 700 of the illustrated example employs pillars 720 (e.g., pillars or routed pillars) that can be coupled and/or joined to backend layers 708 of the semiconductor dies 704 and can include one or more metallic layers for supporting communications of the semiconductor package 700. In some examples, the pillars 720 are employed for power delivery, or for ground purposes, and/or electromagnetic interference (EMI) shielding.

Referring to FIGS. 7A-7C, in operation, the channel 718 provides a horizontal channel defined by metallic transmission line 710 and a portion of the standoff substrate 702*a* adjacent the transmission line 710. One or more signals 738 propagate through the transmission line 710 and/or the standoff substrate 702*a* to enable bilateral communication of information and data between the first semiconductor die 704*a* and the second semiconductor die 704*b*. In some examples, the semiconductor package 700 utilizes the ground plane 712 of the third backend layer 708*c* (e.g., via the TSVs 726) to contain or isolate signals in the channel 718. In some examples, the semiconductor package 700 (e.g., the standoff substrate 702*a*) utilizes vias (not shown in the figure but similar to the TSVs 726) to deliver power to die 704.

The channel 718 of the semiconductor package 700 of the illustrated example can transmit various signal types. For example, the channel 718 of the illustrated example can operate as a lowpass baseband channel and propagate an electromagnetic signal including very low frequency spectrum (e.g., direct current (DC), signals of less than 100 MHz, signals of less than 100 KHz, etc.). In some examples, the example semiconductor package 700 can be used with lower mmWave frequencies (e.g., signals having frequencies less than 300 GHz) while channel 718 can be a passband channel. In some examples, the semiconductor package 700 utilizes the ground plane 712 of the backend layer 908*c* (e.g., via the TSVs 726) to control impedance and/or provide electromagnetic shielding for the channel 718.

Figure 8:
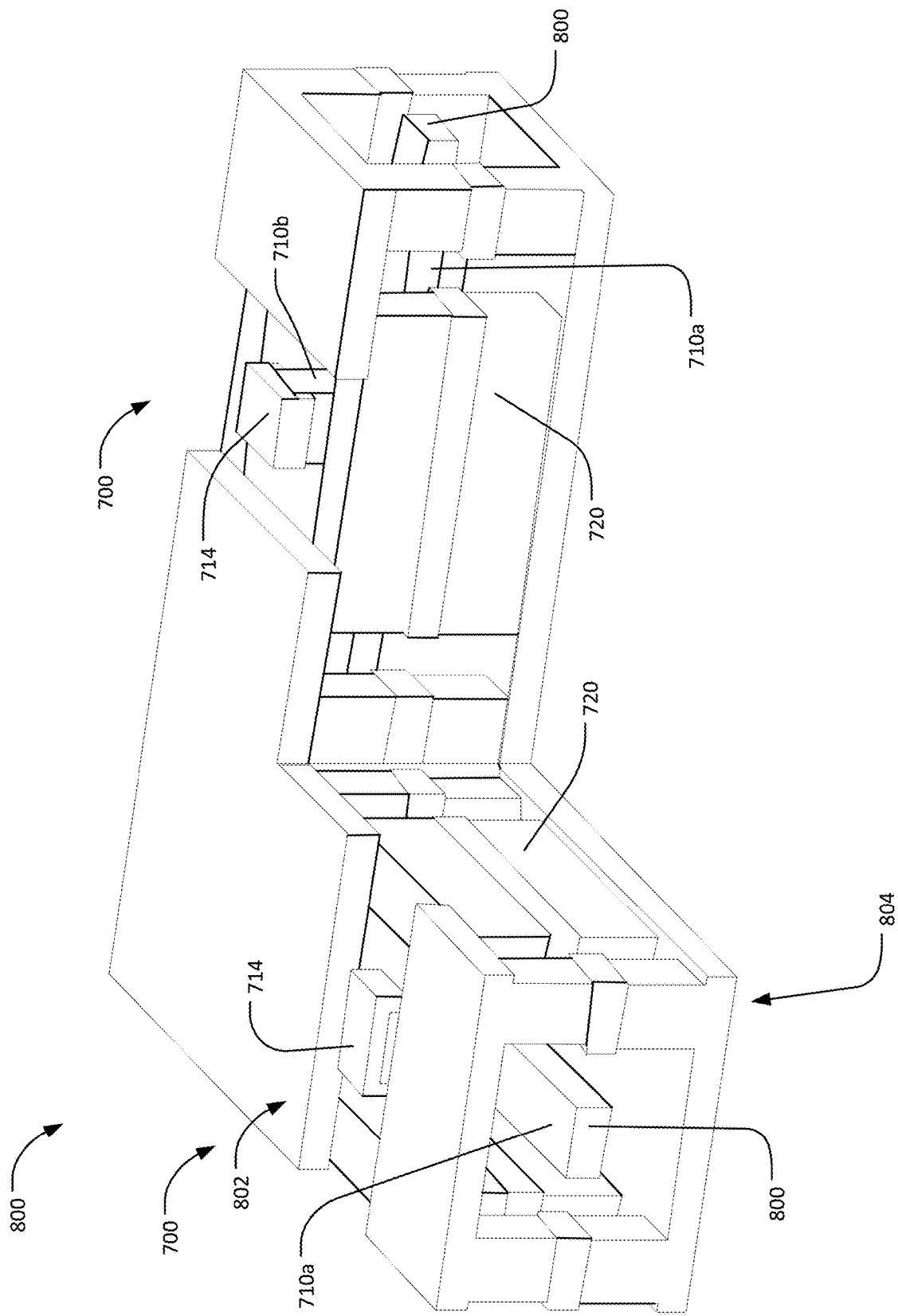
FIG. 8 is a perspective, partial view of an example semiconductor assembly disclosed herein formed via a plurality of semiconductor packages of FIGS. 7A-7C.

FIG. 8 is a perspective view of a semiconductor package assembly 800 that can be formed from a plurality of semiconductor packages 700 of FIGS. 7A-7C. The waveguide interconnect 702 and the die layers 706 are not shown for clarity. For example, the semiconductor packages 700 of FIG. 7A can be assembled to form a coaxial structure defining a coaxial transmission line 810. The coaxial transmission line 810 (e.g., formed from the first portion 710*a* of the transmission line 710 of FIG. 7A) is a lateral transmission line (e.g., a horizontal transmission line). The coaxial transmission line 810 of the illustrated example is embedded in the waveguide interconnect 702. The coaxial transmission line 810 enables electrical connectivity with semiconductor dies (e.g., the first and second semiconductor dies 704*a*, 704*b* of FIG. 7A) via the second portion 710*b* of the transmission line 710 and the contact pads 714 of the backend layers 708. In some examples, the coaxial transmission line located on a first side 802 (e.g., above) the coaxial transmission line 810 or with one or more semiconductor dies (e.g., the third semiconductor die 710*c*) located on a second side 804 (e.g., below) the coaxial transmission line 810. For example, the coaxial transmission line 810 can couple to backend layers 708 (or redistribution layers (RDL)) located at a first edge (e.g., a top end) of the standoff substrate 702*a* and/or to backend layers 708 (or RDL) located at a second edge (e.g., a bottom edge) of the standoff substrate 702*a*.

Figure 9:
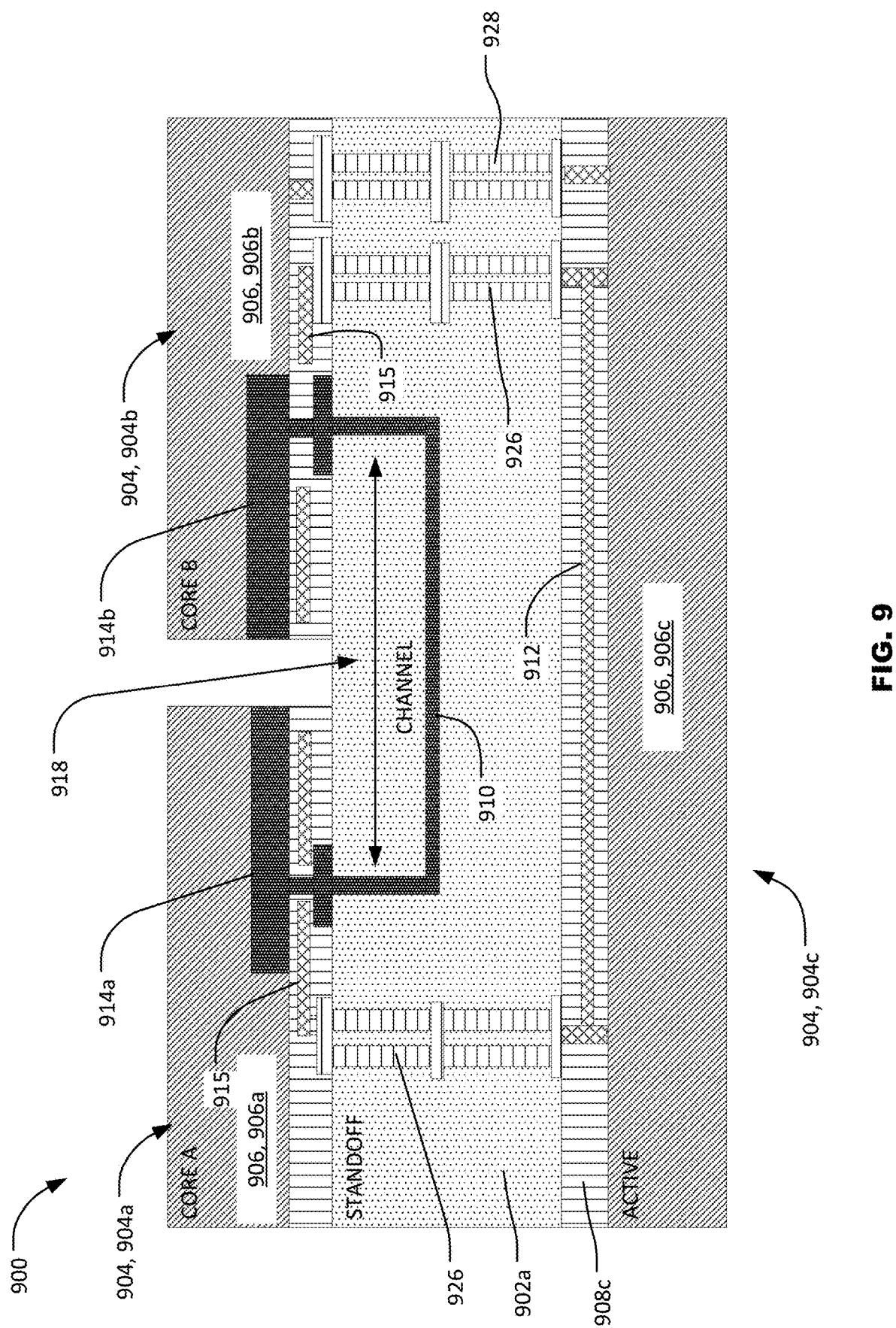
FIG. 9 is a cross-sectional view of an example semiconductor package that includes another example waveguide interconnect disclosed herein.

FIG. 9 is a cross-sectional view of an example semiconductor package 900 that includes another example waveguide interconnect 902 disclosed herein. The waveguide interconnect 902 of the illustrated example defines a channel 918 for transmitting signals (e.g., electromagnetic signals and electrical signals) between a first semiconductor die 904*a* and a second semiconductor die 904*b*. The channel 918 of the illustrated example includes a transmission line 910 positioned in a standoff substrate 902*a* of the waveguide interconnect 902. The channel 918 of the illustrated example is substantially similar to the waveguide interconnect of FIG. 7A except the transmission line 910 of the illustrated example is communicatively coupled to a first connector 914*a* (e.g., a first high speed input/output interconnect) located in a first die layer 906*a* of the first semiconductor die 904*a* and a second connector 914*b* (e.g., a first high speed input/output interconnect) located in a second die layer 906*b* of the second semiconductor die 904*b*. The standoff substrate 902*a* of the illustrated example includes TSVs 926 (e.g., similar to the TSVs 726 of FIG. 7A) to couple respective ground planes 915 of the first and second semiconductor dies 904*a*, 904*b* to a ground plane 912 of the third semiconductor die 906c. Thus, in some examples, the TSVs 926 provide electromagnetic shielding for the transmission line 910. Additionally, the semiconductor package 900 of the illustrated example includes a TSV 928 (e.g., a metal TSV) formed in the standoff substrate 902a separate from the TSVs 926 that provides power to the to one or more of the semiconductor dies 904. The TSV 928 of the illustrated example has a circular shape. However, in some examples, the TSV 928 can have a square shape, a rectangular shape, an oblong shape, and/or any other shape. The TSV 928 can be implemented with other examples disclosed herein. In some examples, the cross-section of FIG. 9 illustrates or reveals a transmission line and ground planes on top and bottom dies.

Figure 10:
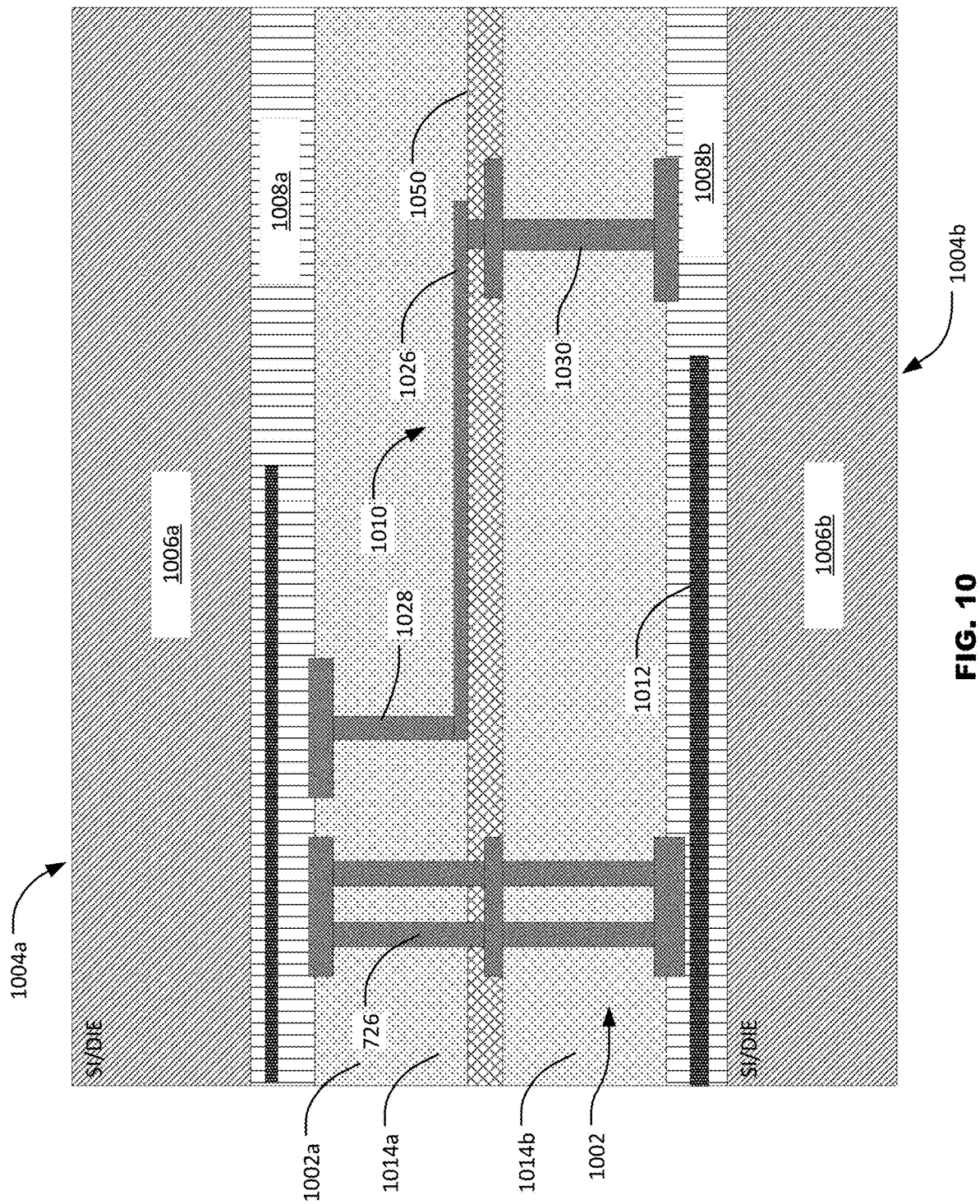
FIG. 10 is a cross-sectional view of another example semiconductor package including another example waveguide interconnect disclosed herein.

FIG. 10 is a cross-sectional view of another example semiconductor package 1000 including another example waveguide interconnect 1002 disclosed herein. The semiconductor package 1000 of the illustrated example includes a first semiconductor die 1004a and a second semiconductor die 1004b. The first semiconductor die 1004a includes a first die layer 1006a and a second backend layer 1008b and the second semiconductor die 1004b includes a second die layer 1006b and a second backend layer 1008b. The waveguide interconnect 1002 of the illustrated example includes a standoff substrate 1002a positioned between the first and second backend layers 1008a, 1008b of the respective first and second semiconductor dies 1004a, 1004b. The waveguide interconnect 1002 of the illustrated example includes a transmission line 1010 communicatively and/or electrically coupling the first semiconductor die 1010a (e.g., the first backend layer 1008a) and the second semiconductor die 1010b (e.g., the second backend layer 1008b). For instance, the transmission line 1010 can transmit electrical signals and/or a channel 1018 formed by standoff substrate 1002a and the transmission line 1010 can transmit electromagnetic signals (e.g., vertically). The transmission line 1010 of the illustrated example includes a first portion 1026 (e.g., a horizontal portion), a second portion 1028 and a third portion 1030 positioned in the standoff substrate 1002a. The first portion 1026 is positioned between and electrically couples the second portion 1028 and the third portion 1030. The second portion 1028 electrically couples the first portion 1026 to the first semiconductor die 1004a and the third portion 1030 electrically couples the first portion 1026 to the second semiconductor die 1004b. The transmission line 1010 of the illustrated example communicatively couples vertically stacked semiconductor dies. The standoff substrate 1002a includes the TSV 726 to couple the first semiconductor 1004a to a ground plane. In some examples, the first portion 1026 of the transmission line 1010 is encased or enclosed (e.g., completely encased) within the standoff substrate 1002a. In some examples, the second portion 1028 and/or the third portion 1030 are encased (e.g., completely encased) in the standoff substrate 1002a. In some examples, the first portion 1026 can have any desired length in the horizontal direction.

The standoff substrate 1002a of the illustrated example include a first substrate layer 1014a and a second substrate layer 1014b. To couple the first substrate layer 1014a and the second substrate layer 1014b, the semiconductor package 1000 of the illustrated example employs a bond layer 1050. In this manner, the first portion 1026 and the second portion 1028 of the transmission line 1010 can be formed with the first substrate layer 1014a and the third portion 1030 of the transmission line 1010 can be formed with the second substrate layer 1014b.

Figure 11:
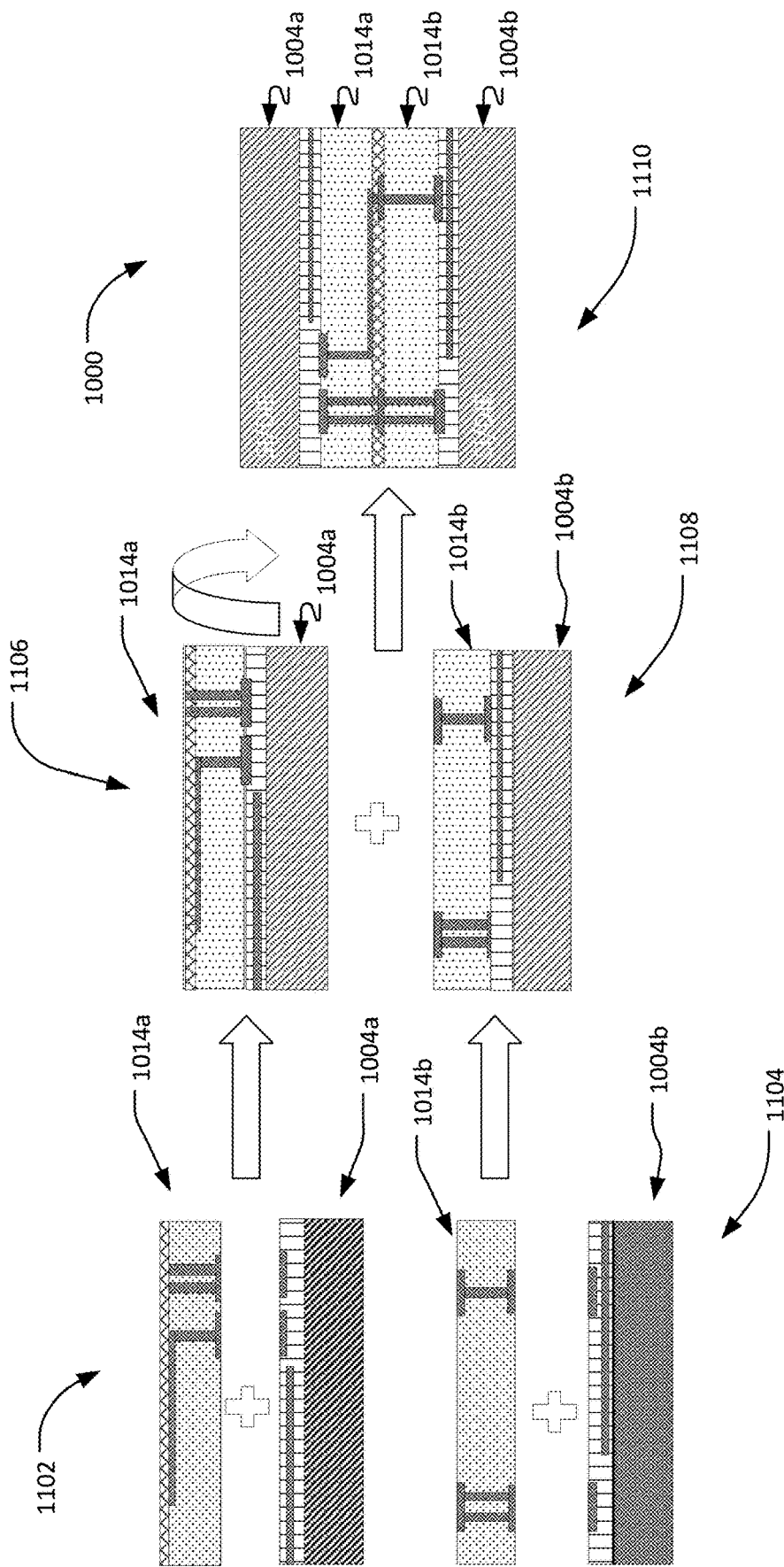
FIG. 11 represents a process flow including cross-sectional schematic illustrations of the example semiconductor of FIG. 10 at various manufacturing stages.

FIG. 11 include cross-sectional schematic illustrations of the semiconductor package 1000 of FIG. 10 at various manufacturing stages 1102-1110. While an example manner of forming the example semiconductor package 1000 has been illustrated in FIG. 11, one of the steps and/or processes illustrated in FIG. 11 may be combined, divided, re-arranged, omitted, eliminated and/or implemented in any other way. Further still, the example methods of FIG. 11 may include processes and/or steps in addition to, or instead of, those illustrated in FIG. 11 and/or may include more than one of any or all of the illustrated processes and/or steps. Further, although the example methods are described with reference to FIG. 11, many other methods or processes of forming the semiconductor package 1000 can alternatively be used.

The first semiconductor 1004a, the second semiconductor die 1004b, the first substrate layer 1014a, and the second substrate layer 1014b are formed using conventional manufacturing techniques. In particular, the first semiconductor 1004a, the second semiconductor die 1004b, the first substrate layer 1014a, and the second substrate layer 1014b can be formed on different wafers or substrates. For example, some example processes that can be used to form the first semiconductor 1004a, the second semiconductor die 1004b, the first substrate layer 1014a, and the second substrate layer 1014b include photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of semiconductor devices.

At 1102, after formation of the first semiconductor 1004a, the second semiconductor die 1004b, the first substrate layer 1014a, and the second substrate layer 1014b, the method begins by joining the first semiconductor die 1104a and the first substrate layer 1014a. Specifically, the first semiconductor die 1004a and the first substrate layer 1014a are oriented wrong side up (e.g., upside down) so that the first semiconductor die 1004a is positioned below or beneath the first substrate layer 1014a.

At 1104, the second semiconductor die 1104b and the second substrate layer 1014b are jointed or coupled together. Specifically, the second semiconductor die 1004b and the second substrate layer 1014b are oriented right side up (downside up) so that the second semiconductor die 1004b is positioned below or beneath the second substrate layer 1014b.

At 1106, the first semiconductor die 1004a is attached to the first substrate layer 1014a via a hybrid bonding. Likewise, at 1108, the second semiconductor die 1004b is attached to the second substrate layer 1014b via hybrid bonding. At 1110, the first semiconductor die 1004a and the first substrate layer 1014a are flipped (e.g., rotated 180 degrees) and positioned on the second substrate layer 1014b. At 1110, the first substrate layer 1014a and the second substrate layer 1014b are coupled via hybrid bonding, to form the semiconductor package 1000. The semiconductor package 1000 of the illustrated example includes the bond layer 1050. In some examples, the semiconductor package 1000 does not include the bond layer 1050.

The example manufacturing process of FIG. 11 can be employed to fabricate example semiconductor packages disclosed herein. For example, the semiconductor packages

100, 200, 300, 400, 500, 600, 700, 800, 900 and 1000 can be fabricated using one or more processes shown in FIG. 11.

The foregoing examples of the semiconductor packages 100, 200, 300, 400, 500, 600, 700, 800, 900 and 1000 teach or suggest different features. Although each example the semiconductor package 100, 200, 300, 400, 500, 600, 700, 800, 900 and 1000 disclosed above has certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Example methods, apparatus, systems, and articles of manufacture to implement symmetric cascade thrust reversers systems are disclosed herein. Further examples and combinations thereof include the following:

Example 1 includes a semiconductor package including a first semiconductor die, a second semiconductor die, and a substrate positioned between the first and second dies. The substrate includes a waveguide interconnect to provide a communication channel to carry an electromagnetic signal. The waveguide interconnect is defined by a plurality of through substrate vias (TSVs). The TSVs in a pattern around the at least the portion of the substrate to define a boundary of the communication channel.

Example 2 includes the semiconductor package of example 1, where the TSVs are hollow TSVs.

Example 3 includes the semiconductor package of examples 1 or 2, wherein the waveguide interconnect includes a dielectric material.

Example 4 includes the semiconductor package of any one of examples 1-3, wherein the channel provides a straight path between the first semiconductor die and a third semiconductor die.

Example 5 includes the semiconductor package of any one of examples 1-4, wherein the first semiconductor die is positioned laterally relative to the third semiconductor die, the communication channel extending in a sideways direction to span a distance between the first semiconductor die and the third semiconductor die.

Example 6 includes the semiconductor package of any one of examples 1-5, wherein the communication channel extends in a vertical direction to span a distance between the first semiconductor die and the second semiconductor die.

Example 7 includes the semiconductor package of any one of examples 1-6, wherein the channel provides an arcuate path between the first semiconductor die and a third semiconductor die.

Example 8 includes the semiconductor package of any one of examples 1-7, wherein the TSVs are first TSVs and the substrate includes a plurality of blind TSVs that partially extend into the substrate, the blind TSVs in a first plane, the first TSVs in a second plane.

Example 9 includes the semiconductor package of any one of examples 1-8, wherein the first and second planes are perpendicular.

Example 10 includes the semiconductor package of any one of examples 1-9, wherein the TSVs define a length and a width of the channel and the blind TSVs define a thickness of the channel.

Example 11 includes the semiconductor package of any one of examples 1-10, wherein the length and width have a rectangular shape.

Example 12 includes the semiconductor package of any one of examples 1-11, wherein at least some of the TSVs are at least one of filled with metal or coated with a metallic material.

Example 13 includes a semiconductor package including a first semiconductor die, a second semiconductor die, the first semiconductor die positioned laterally adjacent the second semiconductor die, a third semiconductor die, and a substrate positioned between the third semiconductor die and the first semiconductor and second semiconductor die. The substrate is to provide a waveguide interconnect to carry an electromagnetic signal between the first semiconductor die and second semiconductor die. The substrate including: a body formed of a dielectric material; and a plurality of first through substrate vias (TSVs) formed in the body. The TSVs defining a boundary of a channel to carry the electromagnetic signal.

Example 14 includes the semiconductor package of example 13, wherein the TSVs include first TSVs and the channel includes a first channel, and wherein the substrate further includes a plurality of shared through substrate vias (shared TSVs) formed in the body, the first TSVs being spaced from the shared TSVs, the first TSVs, the shared TSVs and a portion of the body between the first TSVs and the shared TSVs form the first channel capable of transmitting first electromagnetic signals between the first semiconductor die and the second semiconductor die.

Example 15 includes the semiconductor package of examples 13 or 14, wherein the substrate further includes a plurality of second through substrate vias (second TSVs) formed in the body, the second TSVs and the shared TSVs forming a second channel capable of transmitting second electromagnetic signals between the first semiconductor die and the second semiconductor die.

Example 16 includes the semiconductor package of any one of examples 13-15, wherein the first channel and the second channel are to restrict crosstalk between the first electromagnetic signals propagating in the first channel and the second electromagnetic signals propagating in the second channel.

Example 17 includes the semiconductor package of any one of examples 13-16, wherein at least one of the first TSVs, the second TSVs or the shared TSVs are filled with metal.

Example 18 includes a semiconductor package including a first semiconductor die, the first semiconductor die including a first ground plane, a second semiconductor die, the first semiconductor die positioned adjacent the first semiconductor die, the second semiconductor die including a second ground plane, and a third semiconductor die, the third semiconductor die including a third ground plane. A waveguide interconnect is positioned between the third semiconductor die and the first and second semiconductor dies. The waveguide interconnect to communicatively the first semiconductor die and the second semiconductor die. The waveguide interconnect including a substrate made of a dielectric material, a coaxial transmission line formed in the substrate, the coaxial transmission line including a first portion encased in the substrate. The waveguide interconnect further including a first through substrate via (TSV), the first TSV to electrically couple the first ground plane of the first semiconductor die and the third ground plane of the third semiconductor die, and a second through substrate via (TSV), the second TSV to electrically couple the second ground plane of the second semiconductor die and the third ground plane of the third semiconductor die.

Example 19 includes the semiconductor package of example 18, wherein the coaxial transmission line further includes a second portion and a third portion, the second portion to electrically couple the first portion to a first contact pad of a first semiconductor die, the third portion to electrically couple the first portion to a second contact pad of a second semiconductor die.

Example 20 includes the semiconductor package of examples 18 or 19, wherein the second portion and the third portion are encased in the substrate.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A semiconductor package comprising:
    a first semiconductor die;
    a second semiconductor die; and
    a substrate positioned between the first semiconductor die and the second semiconductor die, the substrate including:
        a waveguide interconnect to provide a communication channel to carry an electromagnetic signal, the waveguide interconnect defined by a plurality of through substrate vias (TSVs), the TSVs in a pattern around at least a portion of the substrate to define a boundary of the communication channel.

2. The semiconductor package of claim 1, wherein the TSVs are hollow TSVs.

3. The semiconductor package of claim 1, wherein the waveguide interconnect includes a dielectric material.

4. The semiconductor package of claim 1, wherein the communication channel provides a straight path between the first semiconductor die and a third semiconductor die.

5. The semiconductor package of claim 4, wherein the first semiconductor die is positioned laterally relative to the third semiconductor die, the communication channel extending in a sideways direction to span a distance between the first semiconductor die and the third semiconductor die.

6. The semiconductor package of claim 4, wherein the communication channel extends in a vertical direction to span a distance between the first semiconductor die and the second semiconductor die.

7. The semiconductor package of claim 1, wherein the communication channel provides an arcuate path between the first semiconductor die and a third semiconductor die.

8. The semiconductor package of claim 1, wherein the TSVs are first TSVs and the substrate includes a plurality of blind TSVs that partially extend into the substrate, the blind TSVs in a first plane, the first TSVs in a second plane.

9. The semiconductor package of claim 8, wherein the first and second planes are perpendicular.

10. The semiconductor package of claim 8, wherein the TSVs define a length and a width of the communication channel and the blind TSVs define a thickness of the communication channel.

11. The semiconductor package of claim 10, wherein the length and width have a rectangular shape.

12. The semiconductor package of claim 1, wherein at least some of the TSVs are at least one of filled with metal or coated with a metallic material.

13. A semiconductor package comprising:
    a first semiconductor die;
    a second semiconductor die, the first semiconductor die positioned laterally adjacent the second semiconductor die;
    a third semiconductor die; and
    a substrate positioned between the third semiconductor die and the first semiconductor and the second semiconductor die, the substrate to provide a waveguide interconnect to carry an electromagnetic signal between the first semiconductor die and second semiconductor die, the substrate including:
        a body formed of a dielectric material; and
        a plurality of first through substrate vias (TSVs) formed in the body, the TSVs defining a boundary of a channel to carry the electromagnetic signal.

14. The semiconductor package of claim 13, wherein the TSVs include first TSVs and the channel includes a first channel, and wherein the substrate further includes a plurality of shared through substrate vias (shared TSVs) formed in the body, the first TSVs being spaced from the shared TSVs, the first TSVs, the shared TSVs and a portion of the body between the first TSVs and the shared TSVs form the first channel capable of transmitting first electromagnetic signals between the first semiconductor die and the second semiconductor die.

15. The semiconductor package of claim 14, wherein the substrate further includes a plurality of second through substrate vias (second TSVs) formed in the body, the second TSVs and the shared TSVs forming a second channel capable of transmitting second electromagnetic signals between the first semiconductor die and the second semiconductor die.

16. The semiconductor package of claim 15, wherein the first channel and the second channel are to restrict crosstalk between the first electromagnetic signals propagating in the first channel and the second electromagnetic signals propagating in the second channel.

17. The semiconductor package of claim 15, wherein at least one of the first TSVs, the second TSVs or the shared TSVs are filled with metal.

18. A semiconductor package comprising:
a first semiconductor die, the first semiconductor die including a first ground plane;
a second semiconductor die, the second semiconductor die positioned adjacent the first semiconductor die, the second semiconductor die including a second ground plane;
a third semiconductor die, the third semiconductor die including a third ground plane;
a waveguide interconnect positioned between the third semiconductor die and the first and second semiconductor dies, the waveguide interconnect to communicatively couple the first semiconductor die and the second semiconductor die, the waveguide interconnect including:
a substrate made of a dielectric material;
a coaxial transmission line formed in the substrate, the coaxial transmission line including a first portion encased in the substrate;
a first through substrate via (TSV), the first TSV to electrically couple the first ground plane of the first semiconductor die and the third ground plane of the third semiconductor die; and
a second through substrate via (TSV), the second TSV to electrically couple the second ground plane of the second semiconductor die and the third ground plane of the third semiconductor die.

19. The semiconductor package of claim 18, wherein the coaxial transmission line further includes a second portion and a third portion, the second portion to electrically couple the first portion to a first contact pad of a first semiconductor die, the third portion to electrically couple the first portion to a second contact pad of a second semiconductor die.

20. The semiconductor package of claim 19, further including a third through substrate via (TSV), the third TSV to provide power delivery to at least one of the first semiconductor die or the second semiconductor die.

21. The semiconductor package of claim 1, wherein the TSVs are at least one of hollow, filled with a gas or filled with a dielectric material.

22. The semiconductor package of claim 1, wherein the TSVs define a perimeter of the communication channel.

* * * * *